United States Patent
Sugiura et al.

(10) Patent No.: US 10,388,597 B2
(45) Date of Patent: Aug. 20, 2019

(54) MANUFACTURING METHOD FOR SEMICONDUCTOR DEVICE AND SEMICONDUCTOR DEVICE

(71) Applicant: RENESAS ELECTRONICS CORPORATION, Tokyo (JP)

(72) Inventors: Masatoshi Sugiura, Gunma (JP); Hiroi Oka, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/985,957

(22) Filed: May 22, 2018

(65) Prior Publication Data
US 2019/0006268 A1 Jan. 3, 2019

(30) Foreign Application Priority Data
Jun. 29, 2017 (JP) ................. 2017-128027

(51) Int. Cl.
*H01L 23/495* (2006.01)
*H01L 23/00* (2006.01)
*H01L 21/48* (2006.01)

(52) U.S. Cl.
CPC .... *H01L 23/49568* (2013.01); *H01L 21/4825* (2013.01); *H01L 23/49513* (2013.01); *H01L 23/49524* (2013.01); *H01L 23/49562* (2013.01); *H01L 24/08* (2013.01); *H01L 24/48* (2013.01); *H01L 23/562* (2013.01); *H01L 2224/0603* (2013.01); *H01L 2224/48247* (2013.01); *H01L 2224/48472* (2013.01); *H01L 2224/4903* (2013.01); *H01L 2224/73265* (2013.01); *H01L 2224/83192* (2013.01);

(Continued)

(58) Field of Classification Search
CPC ......... H01L 23/49568; H01L 23/49513; H01L 21/4825; H01L 23/562; H01L 24/48; H01L 24/08; H01L 2924/3511
USPC .................. 257/782, 679, 693, 777, 724
See application file for complete search history.

(56) References Cited

U.S. PATENT DOCUMENTS

2014/0103510 A1* 4/2014 Andou .............. H01L 23/49551
257/676
2015/0200181 A1* 7/2015 Haga .................... B23K 20/005
438/127
(Continued)

FOREIGN PATENT DOCUMENTS

JP   2014-029897 A   2/2014

*Primary Examiner* — Bo Fan
(74) *Attorney, Agent, or Firm* — McDermott Will & Emery LLP

(57) ABSTRACT

A die bonding process for assembling a semiconductor device includes the steps of applying a sintered-silver-use paste to each of a plurality of first regions on an upper surface of a chip mounting part, drying the sintered-silver-use paste and applying a silver paste to a second region located between/among the respective first regions. Further, the process includes the step of mounting a semiconductor chip onto the chip mounting part in such a manner that a rear surface of the semiconductor chip faces an upper surface of the chip mounting part with the sintered-silver-use paste and the silver paste being interposed. After mounting the chip, part of each of first, second, third and fourth corners of a principal surface of the semiconductor chip is located in each of the first regions.

20 Claims, 39 Drawing Sheets

(52) U.S. Cl.
CPC ............ *H01L 2224/92247* (2013.01); *H01L 2924/13055* (2013.01); *H01L 2924/181* (2013.01); *H01L 2924/3511* (2013.01)

(56) References Cited

U.S. PATENT DOCUMENTS

| | | | |
|---|---|---|---|
| 2016/0204057 A1* | 7/2016 | Yato | H01L 23/562 |
| | | | 257/684 |
| 2016/0218259 A1* | 7/2016 | Yamada | H01L 33/56 |
| 2016/0260657 A1* | 9/2016 | Mizawa | H01L 24/92 |
| 2016/0293563 A1* | 10/2016 | Fujino | H01L 25/162 |
| 2016/0354868 A1* | 12/2016 | Matsugi | B23K 35/26 |

* cited by examiner

FIG. 13

|  | SILVER PASTE | SINTERED-SILVER-USE PASTE |
|---|---|---|
| SILVER CONTENT | 60-90 wt% | 80 wt% AT LEAST |
| RESIN & SOLVENT BLENDING QUANTITY | TO 40 wt% | TO 20 wt% |

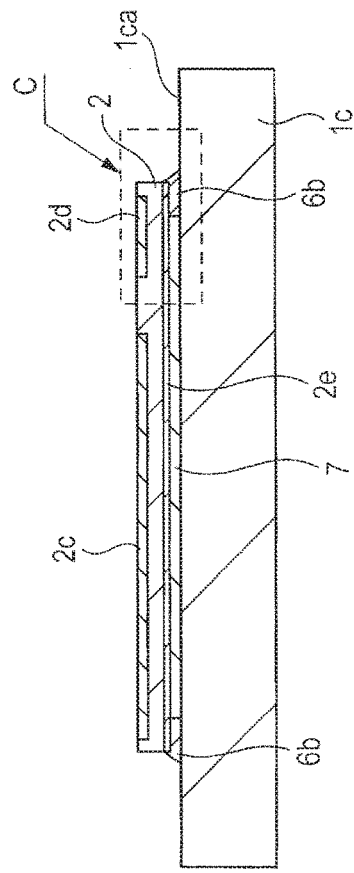
FIG. 18

MANUFACTURING METHOD FOR SEMICONDUCTOR DEVICE AND SEMICONDUCTOR DEVICE

CROSS-REFERENCE TO RELATED APPLICATIONS

The disclosure of Japanese Patent Application No. 2017-128027 filed on Jun. 29, 2017 including the specification, drawings and abstract is incorporated herein by reference in its entirety.

BACKGROUND

The present invention relates to, for example, a power semiconductor device and a manufacturing method for the power semiconductor device.

In the power semiconductor device for which high adaptability to heat dissipation is requested, a silver paste and a sintered-silver-use paste (a paste for forming sintered silver) are known as examples of die bonding materials used when mounting a semiconductor chip onto a die pad (a chip mounting part) with consideration for the viewpoint of environmental countermeasures (lead-free).

A structure of the semiconductor device in which a sintered bonding material is used as the die bonding material is disclosed in Japanese Unexamined Patent Application Publication No. 2014-29897.

SUMMARY

In a case where the silver paste is used as the die bonding material in the above-described power semiconductor device, thermal stress occurs in a temperature cycle test and so forth performed after completion of a product due to a difference in linear expansion coefficient between the semiconductor chip and the die pad and the thermal stress is concentrated on the silver paste which is located directly under corners of the semiconductor chip.

It is found from examinations made by the inventors of the present application that destruction (crakes, delamination and so forth) occurs on a portion and its vicinity of the silver paste which is bonded to the semiconductor chip directly under each corner of the semiconductor chip as a result of concentration of the thermal stress. Accordingly, the inventors of the present application examined a case where the sintered-silver-use paste is used as the die bonding material as countermeasures against the destruction of the die bonding material which occurs directly under each corner of the semiconductor chip. According to this examination, the high-strength sintered silver is arranged directly under each corner of the semiconductor chip on which the thermal stress is concentrated and therefore it is possible to suppress the destruction of the die bonding material which becomes an issue when the silver paste is used as the die bonding material.

On the other hand, although a die pad exposed type semiconductor device is known as a structure of the semiconductor device for which the high adaptability to heat dissipation is requested, there also exists a semiconductor device that a thickness of the die pad is thinned for further improvement of heat dissipation property.

However, it is found from the examination made by the inventors of the present application that in a case where the sintered-silver-use paste is used as the die bonding material for the semiconductor device that the thickness of the die pad is thinned, the die pad is deformed by contraction which occurs when curing the paste and deformation adversely affects an amount of warpage of the semiconductor device (the product).

Other issues and novel features of the present invention will become apparent from the description of the present specification and the appended drawings.

According to one embodiment of the present invention, there is provided one manufacturing method for semiconductor device which includes the steps of (a) providing a semiconductor chip having a first front surface and a first rear surface, (b) providing a lead frame which includes a chip mounting part having a second front surface and a second rear surface, (c) applying a sintered-silver-use paste to each of a plurality of first regions on the second front surface of the chip mounting part and (d) drying the sintered-silver-use paste. The manufacturing method further includes the steps of (e) applying a silver paste to a second region which is located between/among the plurality of respective first regions, (f) mounting the semiconductor chip onto the chip mounting part in such a manner that the first rear surface of the semiconductor chip faces the second front surface of the chip mounting part with the sintered-silver-use paste and the silver paste being interposed. The manufacturing method further includes the step of (g) applying heat and pressure to the semiconductor chip and thereby bonding the first rear surface of the semiconductor chip, and the sintered-silver-use paste and the silver paste together. Here, the semiconductor chip has a first side and a second side which extend in a first direction, and a third side and a fourth side which extend in a second direction which intersects the first direction in a planar view. In addition, the semiconductor chip further has a first corner at which the first side and the third side intersect each other, a second corner at which the third side and the second side intersect each other, a third corner at which the second side and the fourth side intersect each other and a fourth corner at which the fourth side and the first side intersect each other in the planar view. Further, after the step (f), part of each of the first corner, the second corner, the third corner and the fourth corner is located in each of the plurality of first regions in the planar view.

According to one embodiment, there is also provided another manufacturing method for semiconductor device which includes the steps of (a) providing a semiconductor chip having a first front surface and a first rear surface, (b) providing a lead frame which includes a chip mounting part having a second front surface and a second rear surface and (c) applying one of a sintered-silver-use paste and a silver paste to the second front surface of the chip mounting part. The manufacturing method further includes the steps of (d) applying the other of the sintered-silver-use paste and the silver paste to the second front surface of the chip mounting part and (e) mounting the semiconductor chip onto the chip mounting part in such a manner that the first rear surface of the semiconductor chip faces the second front surface of the chip mounting part with the sintered-silver-use paste and the silver paste being interposed. The manufacturing method further includes the step of (f) applying heat to the semiconductor chip and thereby bonding the first rear surface of the semiconductor chip, and the sintered-silver-use paste and the silver paste together. Here, the sintered-silver-use paste is applied to each of a plurality of first regions on the second front surface of the chip mounting part and the silver paste is applied to a second region which is located between/among the plurality of respective first regions. In addition, the semiconductor chip has a first side and a second side which extend in a first direction, and a third side and a fourth side which extend in a second direction which intersects the first direction in a planar view. In addition, the semiconductor chip further has a first corner at which the first side and the third side intersect each other, a second corner at which the third side and the second side intersect each other, a third corner at which the second side and the fourth side intersect each other and a fourth corner at which the fourth side and the first side intersect each other in the planar view. Further, after the step (e), part of each of the first corner, the second corner, the third corner and the fourth corner is located in each of the plurality of first regions in the planar view.

In addition, according to one embodiment, there is provided a semiconductor device which includes a semiconductor chip having a first front surface and a first rear surface, a chip mounting part onto which the semiconductor chip is mounted, a first lead which is electrically coupled to the semiconductor chip via a first conductive member, and a second lead which is electrically coupled to the semiconductor chip via a second conductive member. The semiconductor device further includes a sealing body which seals the semiconductor chip, the first conductive member, the second conductive member, part of the chip mounting part, part of the first lead and part of the second lead, in which the first rear surface of the semiconductor chip faces a second front surface of the chip mounting part with the first bonding material and the second boding material being interposed. The second front surface of the chip mounting part has a plurality of first regions in which the first bonding material is located and a second region which is located between/among the plurality of respective first regions and in which the second bonding material is located in a planar view. In addition, the semiconductor chip has a first side which extends in a first direction, a second side which is located on the opposite side of the first side and extends in the first direction, a third side which extends in a second direction which intersects the first direction and a fourth side which is located on the opposite side of the third side and extends in the second direction in the planar view. In addition, the semiconductor chip further has a first corner at which the first side and the third side intersect each other, a second corner at which the third side and the second side intersect each other, a third corner at which the second side and the fourth side intersect each other and a fourth corner at which the fourth side and the first side intersect each other in the planar view. Further, part of each of the first corner, the second corner, the third corner and the fourth corner is located in each of the plurality of first regions in the planar view.

According to the above-described one embodiment, it is possible to improve reliability of the semiconductor device.

BRIEF DESCRIPTION OF THE DRAWINGS

FIG. 13 is a diagram illustrating one example of a comparison in silver content between the sintered-silver-use paste and the silver paste used in the semiconductor device according to the present embodiment.

FIG. 18 is a sectional diagram illustrating one example of the structure cut along the B-B line in FIG. 17.

DETAILED DESCRIPTION

In the following embodiments, description of the same or similar parts will not be repeated in principle unless otherwise deemed particularly necessary.

Further, in the following embodiment, although description will be made by dividing it into a plurality of sections or embodiments when necessary for convenience, these are not unrelated to each other or one another and these are related to each other or one another in such a manner that one covers some or all of modified examples, the details, supplemental explanations and so forth of the other except where clearly stated particularly.

In addition, in the following embodiment, in a case where the number of elements and so forth (the number of units, a numerical value, an amount/a quantity, a range and so forth are included) are referred to, it is not limited to the specific number and may be either at least the specific number or not more than the specific number except where clearly stated particularly and except where obviously limited to the specific number in principle and so forth.

In addition, in the following embodiment, it goes without saying that constitutional elements (element steps and so forth are also included) thereof are not necessarily essential except where clearly stated particularly and except where clearly thought to be essential in principle.

In addition, in the following embodiment, it goes without saying that in a case of saying that one constitutional element or the like "has A" and/or "includes A", it does not exclude elements other than the above element except where clearly stated particularly that it is limited only to the element concerned. Likewise, in the following embodiment, when shapes of the constitutional elements and so forth, a positional relationship between/among them and so forth are referred to, the ones which are substantially approximate to or similar to the shapes and so forth shall be included except where clearly stated particularly and except where clearly thought that they are not approximate or similar thereto in principle. The same is true of the above-mentioned numerical values and ranges.

In the following, an embodiment of the present invention will be described in detail on the basis of the drawings. Incidentally, in all the drawings which are illustrated for description of the embodiment, the same symbols are assigned to the members having the same function and repetitive description thereof will be omitted. In addition, there are cases where hatching is added even in a plan view for clear illustration of the drawings.

Embodiment

<Structure of Semiconductor Device>

Figure 1:
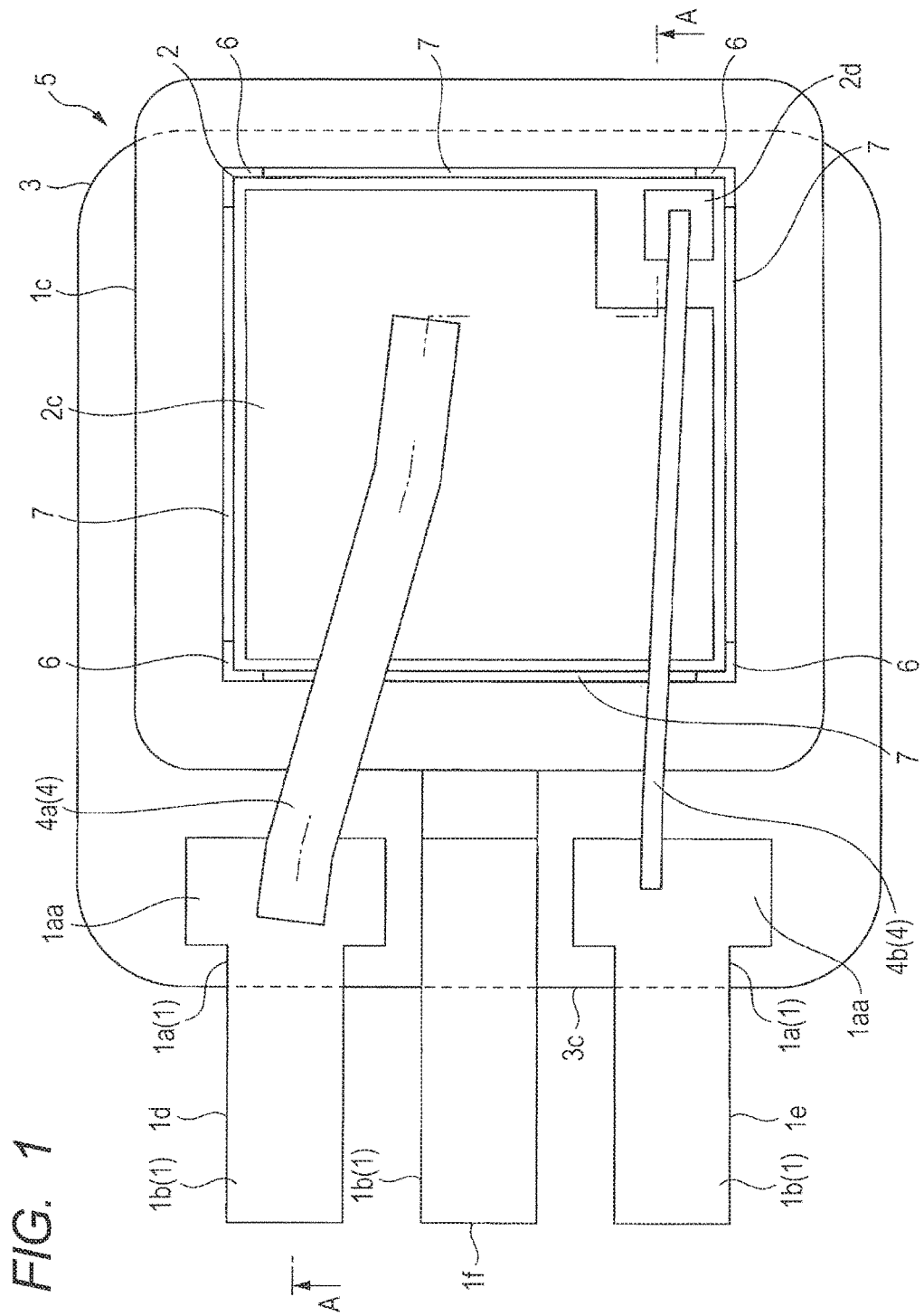
FIG. 1 is a plan view illustrating one example of a structure of a semiconductor device according to one embodiment in a state of seeing through the inside thereof.
Figure 2:
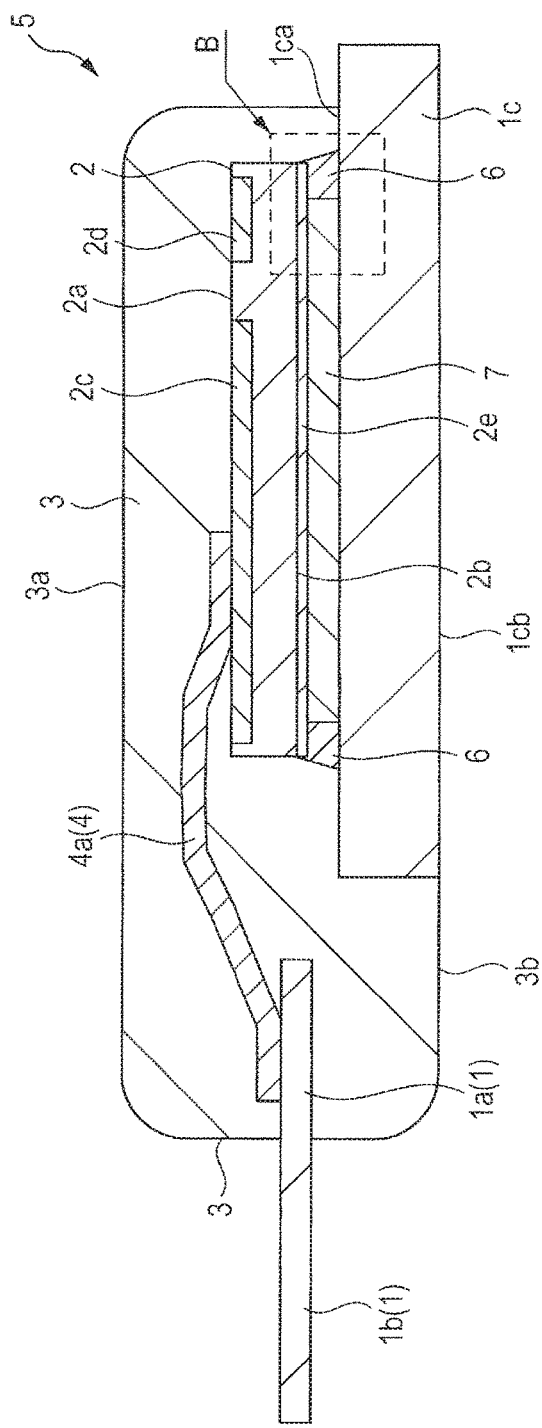
FIG. 2 is a sectional diagram illustrating one example of the structure cut along the A-A line in FIG. 1.
Figure 3:
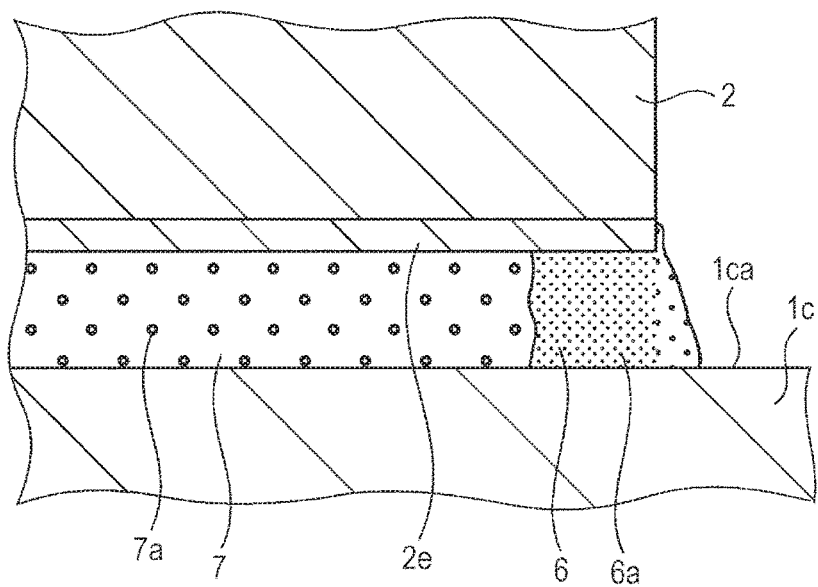
FIG. 3 is an enlarged partial sectional diagram illustrating one example of a structure of a part B in FIG. 2 in an enlarged state.

FIG. 1 is a plan view illustrating one example of a structure of a semiconductor device according to one embodiment in a state of seeing through the inside thereof, FIG. 2 is a sectional diagram illustrating one example of the structure cut along the A-A line in FIG. 1 and FIG. 3 is an enlarged partial sectional diagram illustrating one example of a structure of a part B in FIG. 2 in an enlarged state.

The semiconductor device according to the present embodiment illustrated in FIG. 1 and FIG. 2 is a semiconductor package which includes a sealing body 3 which seals a semiconductor chip (also called a pellet) 2 and is made of an insulating resin and further includes a plurality of lead parts 1 which are located inside and outside the sealing body 3. Incidentally, each of the plurality of lead parts 1 includes an inner lead part 1a which is covered with the sealing body 3 and an outer lead part 1b which is exposed (projects) to the outside from the sealing body 3 and each of the plurality (here, three) of outer lead parts 1b is an external coupling terminal part (an external terminal part) of the semiconductor device.

Then, in the semiconductor device according to the present embodiment, the plurality of outer lead parts 1b project from one desirable side surface 3c of the sealing body 3 as illustrated in FIG. 1. Further, a lower surface (a second rear surface) 1cb of a plate-shaped chip mounting part (also called, an island, a die pad, a header or a tab) 1c which supports the semiconductor chip 2 on its upper surface (a second front surface, a chip mounting surface) 1ca is exposed from a lower surface (a fourth rear surface) 3b of the sealing body 3 as illustrated in FIG. 2. That is, the semiconductor device according to the present embodiment is a surface mount type semiconductor device and is also a semiconductor device for which high adaptability to heat dissipation is requested.

That is, the semiconductor device according to the present embodiment is a power semiconductor device which is able to dissipate heat generated from the semiconductor chip 2 to the outside via the chip mounting part 1c because the lower surface 1cb of the chip mounting part 1c is exposed from the lower surface 3b of the sealing body 3 and therefore is called a TO package or the like which is highly adaptable to heat dissipation.

In addition, in the semiconductor device according to the present embodiment, each of the plurality of outer lead parts 1b is exposed from the sealing body 3 and extends straight.

In the present embodiment, description will be made by giving a power device 5 as one example of the semiconductor device having the above-described structure. For example, a vertical power MOSFET (Metal Oxide Semiconductor Field Effect Transistor) having a trench gate type structure is formed on the semiconductor chip 2 as a power transistor. The power MOSFET has a device structure that a trench is formed in the front surface and a gate is embedded into the trench, includes a source (S) electrode and a gate (G) electrode which are formed to be exposed to a principal surface (a first front surface) 2a of the semiconductor chip 2 and a drain (D) electrode which is formed on a rear surface (a first rear surface) 2b as illustrated in FIG. 2 and large current is applied to the rear surface 2b. Incidentally, although not illustrated in the drawings, the power transistor may be replaced with a power bipolar transistor, an IGBT (Insulated Gate Bipolar Transistor) and so forth as an element to be incorporated into the semiconductor device.

A detailed structure of the power device 5 will be described by using FIG. 1 to FIG. 3. The power device 5 includes the chip mounting part 1c which has the upper surface 1ca and the lower surface 1cb which is located on the opposite side of the upper surface 1ca and the semiconductor chip 2 which is mounted onto the upper surface 1ca of the chip mounting part 1c with a bonding material (a die bonding material) being interposed. The semiconductor chip 2 has the principal surface 2a and includes a source-use electrode pad (a bonding electrode, a bonding pad, a first electrode) 2c and a gate-use electrode pad (a bonding electrode, a boding pad, a second electrode) 2d which are formed to be exposed to the principal surface 2a. Further, the semiconductor chip 2 has the rear surface 2b which is located on the opposite side of the principal surface 2a and is mounted onto the chip mounting part 1c in such a manner that the rear surface 2b faces the upper surface 1ca of the chip mounting part 1c.

Incidentally, the rear surface 2b of the semiconductor chip 2 is formed as an electrode, that is, formed as a drain (D)-use electrode 2e in the power device 5 according to the present embodiment. That is, the semiconductor chip 2 has the main principal surface 2a onto which the source-use electrode pad 2c and the gate-use electrode pad 2d are exposed and the rear surface 2b on which the drain-use electrode 2e is formed (that is, which is formed as the drain-use electrode 2e as described above). Accordingly, it is preferable that the rear surface 2b (the drain-use electrode 2e, a third electrode) and the chip mounting part 1c be coupled together electrically and mechanically by conductive bonding materials.

In the power device 5 according to the present embodiment, sintered silver 6 and a silver paste 7 are used as the conductive bonding materials. That is, the rear surface 2b (the drain-use electrode 2e) of the semiconductor chip 2 and the upper surface 1ca of the chip mounting part 1c are fixedly attached (mechanically coupled) to each other and electrically coupled to each other with the sintered silver 6 and the silver paste 7 being interposed.

Here, since the drain-use electrode (the rear surface electrode) 2e is formed on the rear surface 2b of the semiconductor chip 2, an amount of heat generated from the semiconductor chip 2 is large. Accordingly, the rear surface 2b side of the semiconductor chip 2 acts as a heat dissipation path by using the sintered silver 6 and the silver paste 7 as the bonding materials (the die bonding materials). That is, the power device 5 has a structure that it is possible to transfer heat from the rear surface 2b side of the semiconductor chip 2 to the chip mounting part 1c via the sintered silver 6 and the silver paste 7 and the lower surface 1cb of the chip mounting part 1c is exposed to the lower surface 3b of the sealing body 3.

In addition, the inner lead parts 1a of the plurality (here, two) of lead parts 1 which are arranged along one side of the chip mounting part 1c and two electrode pads on the principal surface 2a of the semiconductor chip 2 are electrically coupled together respectively by conductive wires in a planar view illustrated in FIG. 1. Then, a wide part 1aa which is increased in lead width is formed on an end on the semiconductor chip 2 side of each of the inner lead parts 1a and an Al wire 4 is coupled to the wide part 1aa.

In addition, the plurality of electrode pads which are exposed to the principal surface 2a of the semiconductor chip 2 in the power device 5 according to the present embodiment are the source-use electrode pad 2c and the gate-use electrode pad 2d which is smaller than the source-use electrode pad 2c in planar-view size.

In addition, the sealing body 3 illustrated in FIG. 1 and FIG. 2 has the side surface 3c from which the respective lead parts 1 project and the three outer lead parts 1b project from this side surface 3c. Further, the sealing body 3 has an upper surface (a third front surface) 3a and the lower surface (the fourth rear surface) 3b which is located on the opposite side of the upper surface 3a and seals part (the upper surface 1ca side) of the chip mounting part 1c, the semiconductor chip 2 and the plurality of Al wires 4 (an Al wire 4a and an Al wire 4b) in such a manner that the lower surface 1cb of the chip mounting section 1c is exposed to the lower surface 3b of the sealing body 3.

Since the semiconductor device according to the present embodiment is the power device 5, the two outer lead parts 1b in the three lead parts 1 which project from the side surface 3c of the sealing body 3 are a source (S) lead 1d and a gate (G) lead 1e as illustrated in FIG. 1. In addition, the rear surface 2b of the semiconductor chip 2 is formed as the drain (D)-use electrode (the rear surface electrode) 2e as described above and therefore the lower surface 1cb of the chip mounting part 1c which is exposed to the lower surface 3b of the sealing body 3 acts as the drain (D)-use electrode as illustrated in FIG. 2. Then, the remaining one outer lead part 1b which projects from the side surface 3c is a drain lead which is linked to the chip mounting part 1c.

Incidentally, each of the outer lead parts 1b which is electrically coupled to each of the two electrode pads 2c and 2d on the principal surface 2a of the semiconductor chip 2a via each Al wire 4 is formed integrally with the inner lead part 1a. That is, the source lead 1d of the outer lead part 1b is integrally linked with the source lead 1d of the inner lead part 1a and the gate lead 1e of the outer lead part 1b is integrally linked with the gate lead 1e of the inner lead part 1a as illustrated in FIG. 1. Therefore, each of the inner lead part (part thereof) 1a of the source lead (a first lead) 1d and the inner lead part (part thereof) 1a of the gate lead (a second lead) 1e is embedded into the sealing body 3.

Then, the Al wire (the first conductive member) 4a which is large in diameter (wire diameter) is electrically coupled to the wide part 1aa of the source lead 1d and the Al wire 4a is further electrically coupled to the source-use electrode pad (the first electrode) 2c in the coupling electrodes (bonding electrodes) of the semiconductor chip 2.

That is, since large current is applied to the source lead (the first lead) 1d in the plurality of lead parts 1, the source lead 1d and the source-use electrode pad 2c of the semiconductor chip 2 are electrically coupled to each other via the Al wire 4a which is large in diameter (wire diameter).

On the other hand, the Al wire (the second conductive member) 4b which is smaller than the Al wire 4a in diameter (wire diameter) is electrically coupled to the wide part 1aa of the gate lead (the second lead) 1e of the inner lead part 1a and the Al wire 4b is further electrically coupled to the gate-use electrode pad (the second electrode) 2d in the coupling electrodes (the bonding electrodes) of the semiconductor chip 2.

That is, since small current is applied to the gate lead 1a in the plurality of lead parts 1, the gate lead 1e and the gate-use electrode pad 2d of the semiconductor chip 2 are electrically coupled to each other via the thin Al wire 4b.

In addition, the outer lead part 1b which is a suspension lead 1f which is linked to the chip mounting part 1c projects from the side surface 3c of the sealing body 3 as illustrated in FIG. 1.

Incidentally, the chip mounting part 1c, the suspension lead 1f which is linked to the chip mounting part 1c and the plurality of lead parts 1 including the inner lead parts 1a and the outer lead parts 1b are made of, for example, a Cu alloy which contains Cu (copper) as the main component. Then, the wires are made of, for example, Al (aluminum) and so forth. In addition, the sealing body 3 is made of, for example, a thermosetting epoxy resin. However, the sizes and materials of the above-described respective members are not limited to the above-described sizes and materials.

In addition, in the power device 5 according to the present embodiment, the sintered silver (the first bonding material) 6 and the silver paste (the second bonding material) 7 are used as the bonding materials of the semiconductor chip 2 as illustrated in FIG. 2. Specifically, the rear surface 2b of the semiconductor chip 2 faces the upper surface 1ca of the chip mounting part 1c with the sintered silver 6 and the silver paste 7 being interposed. In the bonding materials, the sintered silver 6 is arranged in a first region 1caa (see FIG. 21 which will be described later) which is a region in which each of the four corners of the semiconductor chip 2 is included in a sectional view. That is, the upper surface 1ca of the chip mounting part 1c has the plurality of first regions 1caa in each of which the sintered silver 6 is arranged. On the other hand, the silver paste 7 is arranged in a second region 1cab which is a region located between the first regions 1caa (see FIG. 21 which will be described later) (among the first regions 1caa in the planar view). That is, the upper surface 1ca of the chip mounting part 1c has the second region 1cab which is located between the respective first regions 1caa in the plurality of first regions 1caa and in which the silver paste 7 is arranged. That is, the sintered silver 6 is arranged under each corner and its vicinity of the four corners of the semiconductor chip 2 and its vicinity and the silver paste 7 is arranged under the center and its vicinity of the semiconductor chip 2 in the planar view.

Then, a particle 6a of the sintered silver 6 is sintered and therefore is smaller than a particle 7a of the silver paste 7 in particle size as illustrated in FIG. 3. For example, the particle size of the particle 6a of the sintered silver is in the order of nanometer (nm) and the particle size of the particle 7a of the silver paste is in the order of micrometer (μm). However, the particle size of the particle 6a of the sintered silver 6 which is arranged in a region which protrudes from the semiconductor chip 2 is larger than that of the particle 6a of the sintered silver which is arranged under the semiconductor chip 2 by the amount obtained by not pressing the sintered silver 6 by the semiconductor chip 2.

<Structures that Inventors of Present Application Examined>

Figure 4:
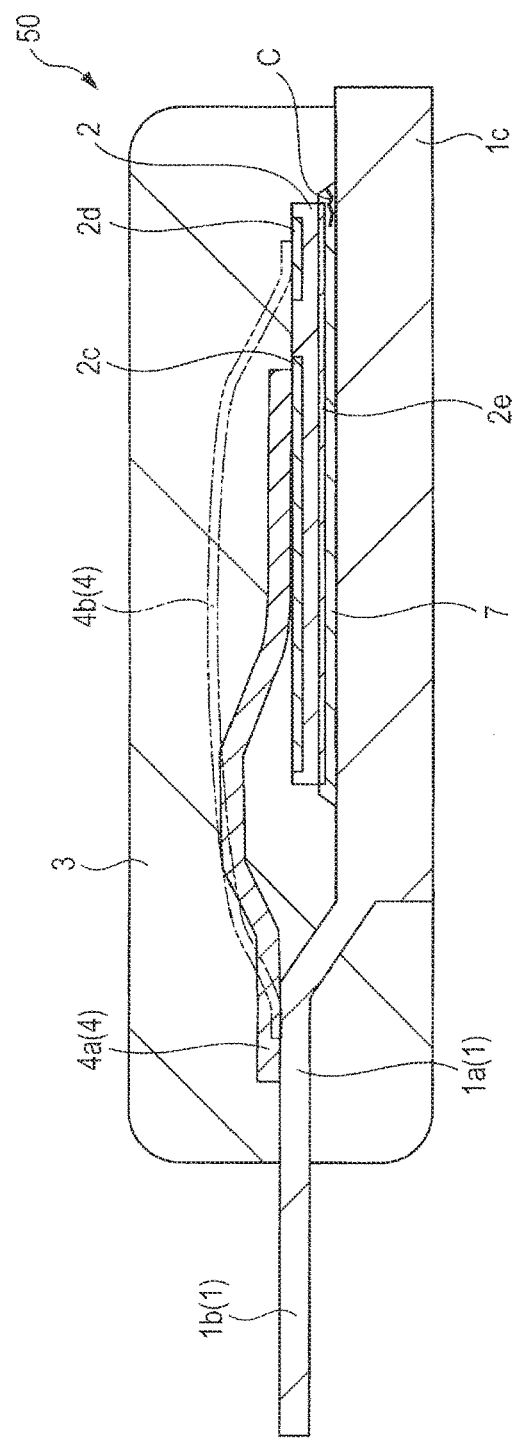
FIG. 4 is a first subject diagram illustrating one example of a structure of a semiconductor device that the inventors of the present application examined.
Figure 5:
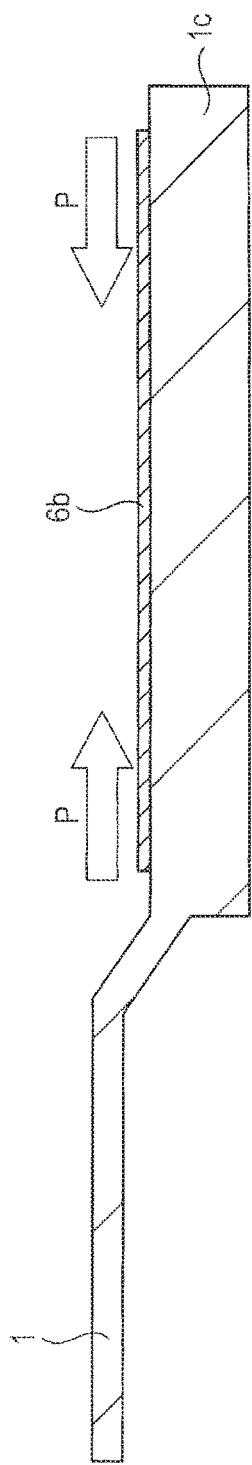
FIG. 5 is a second subject diagram illustrating one example of a structure of a semiconductor device that the inventors of the present application examined.

FIG. 4 is a first subject diagram illustrating one example of a structure of one semiconductor device examined by the inventors of the present application and FIG. 5 is a second subject diagram illustrating one example of a structure of another semiconductor device that the inventors of the present application examined.

The semiconductor device that the inventors of the present application examined will be described using FIG. 4.

The semiconductor device illustrated in FIG. 4 is a semiconductor device 50 for which high adaptability to heat dissipation is requested. The semiconductor device is the on-vehicle semiconductor device 50 which is mainly used around an ECU (Engine Control Unit) and is shipped out as a product whose operation under a condition of an ambient temperature of up to 125° C. is guaranteed for the application to be used in a state of being directly loaded on an engine of a vehicle. In addition, also a product whose junction temperature is guaranteed up to 150° C. is put on the market today. The silver paste 7, a sintered-silver-use paste and so forth are applied as the die bonding materials for fixedly attaching the semiconductor chip 2 in the semiconductor device 50 of the above-mentioned type. However, in a case where the silver paste 7 is used, thermal stress occurs due to a difference in linear expansion coefficient between the semiconductor chip 2 and the die pad (the chip mounting part 1c) in a temperature cycle test and so forth performed after completion of the product. Then, it is found from the examination made by the inventors of the present application that destruction (crakes, delamination) between the semiconductor chip 2 and the die bonding material (hereinafter, referred to as the chip-die bonding material destruction) occurs directly under (a portion C in FIG. 4) a corner of the semiconductor chip 2 due to this thermal stress.

A mechanism that the above destruction occurs under the corner and its vicinity of the semiconductor chip 2 is as follows. The circumference of the die bonding material which is located under the center and its vicinity of the semiconductor chip 2 is restricted by the die bonding material which is located under an outer circumference and its vicinity of the semiconductor chip 2 in the planar view and therefore it is difficult for the center-side die bonding material to contract. On the other hand, the die bonding material which is located under the outer circumference and its vicinity (an end and its vicinity) is reduced in restriction and contracts with ease because its outer side is open. Further, in the outer circumference and its vicinity of the semiconductor chip 2, each corner is the farthest from the center in the planar view and therefore force of contraction of the die bonding material which is located under each corner is increased. Thereby, the die bonding material which is located under each corner contracts most and the stress is concentrated on the corner, and consequently stress concentration leads to occurrence of the above-described destruction.

The inventors of the present application further examined a case of using the sintered-silver-use paste which is a paste used for forming the sintered silver 6 as the die bonding material as countermeasures against the above-mentioned situation.

Since a high-strength sintered-silver-use paste 6b is arranged under the corner of the semiconductor chip 2 on which the thermal stress is concentrated as illustrated in FIG. 5, it is possible to suppress occurrence of the destruction which is an issue in the above-described silver paste 7.

However, there is a product that the die pad (the chip mounting part 1c) is thinned (an exemplary thickness value is not more than 0.4 mm) for further improvement of heat dissipation property in the die pad exposed type semiconductor device and it is found that in a case where the sintered-silver-use paste 6b is used as the die bonding material in this product, the die pad (the chip mounting part 2) is deformed (see a portion P in FIG. 5) caused by contraction occurred when the paste is cured and deformation adversely affects a warpage amount of the product.

Further, it is found from the examination made by the inventors of the present application that when performing assembly in the order of "application of the sintered-silver-use paste"→"drying"→"mounting of the semiconductor chip" in a manufacturing method (a case of a pressing process which will be described later) for the semiconductor device 50 using the sintered-silver-use paste 6b, adhesiveness of the sintered-silver-use paste 6b is reduced and positional displacement of the semiconductor chip 2 occurs in the drying step of drying the sintered-silver-use paste 6b.

Accordingly, in the power device 5 according to the present embodiment illustrated in FIG. 1 and FIG. 2, the sintered silver 6 is applied to the first regions 1caa (see FIG. 21) which the regions which include the corners of the semiconductor chip 2 and the silver paste 7 is applied to the region other than the first regions 1caa (the second region 1cab (see FIG. 21) between one first region 1caa and the other first region 1caa) in the planer view as the die bonding materials for the semiconductor chip 2.

Thereby, occurrence of the chip-die boding material destruction (the crakes, the delamination) directly under each corner of the semiconductor chip 2 becomes difficult irrespective of application of the thermal stress which would occur due to the difference in linear expansion coefficient between the semiconductor chip 2 and the chip mounting part 1c in the temperature cycle test and so forth performed after completion of the semiconductor device.

Thereby, it is possible to improve the reliability of the power device (the semiconductor device) 5.

Incidentally, although description is made by giving the TO package as an example of the power semiconductor chip in the present embodiment, it goes without saying that the semiconductor device according to the present invention also includes other die pad exposed type packages (for example, a die pad exposed type QFP (Quad Flat Package) in which a microcomputer is built) and so forth.

<Manufacturing Method for Semiconductor Device>

1. Provision of Lead Frame

Figure 6:
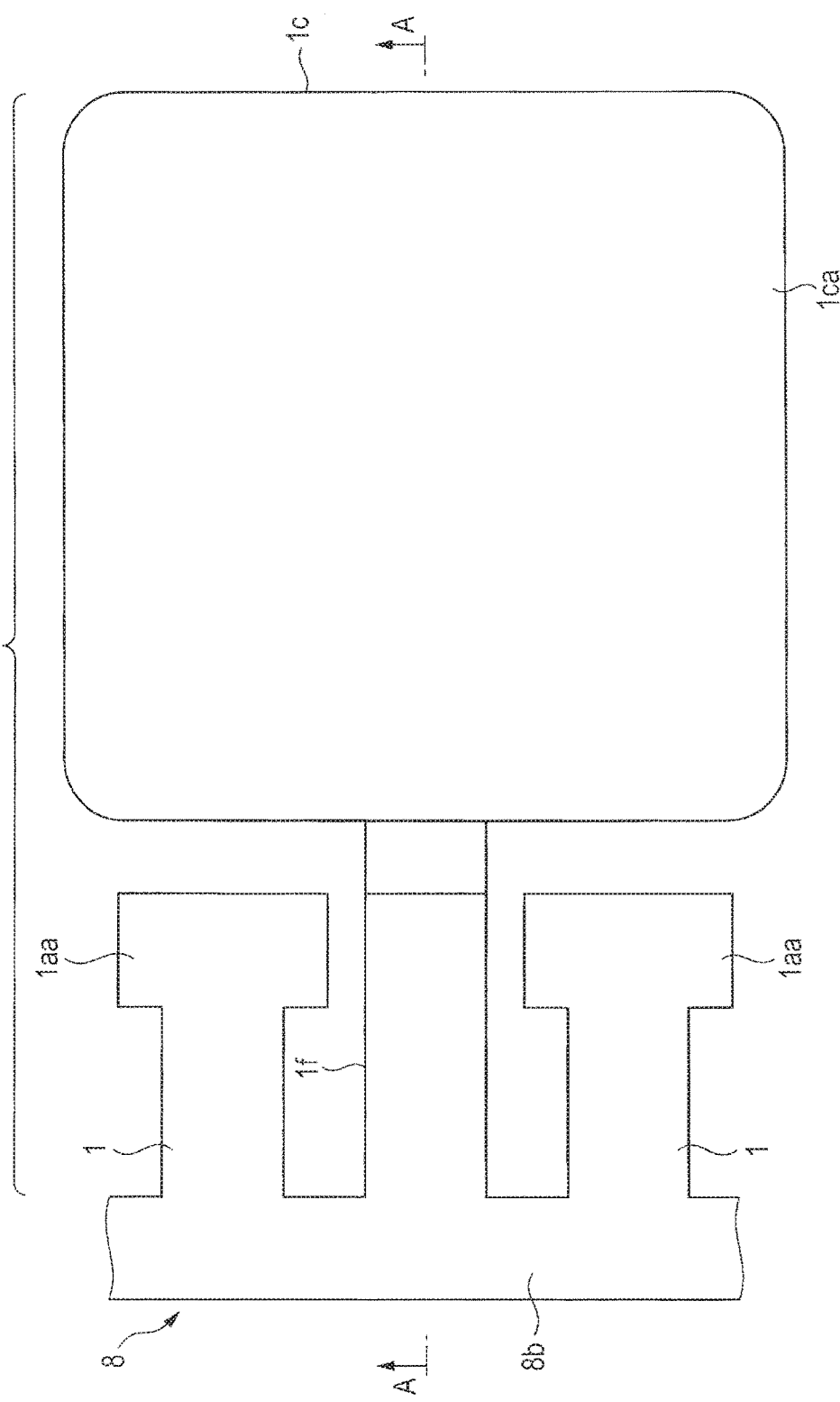
FIG. 6 is a partial plan view illustrating one example of a main part structure of a lead frame used for assembling the semiconductor device illustrated in FIG. 1.
Figure 7:
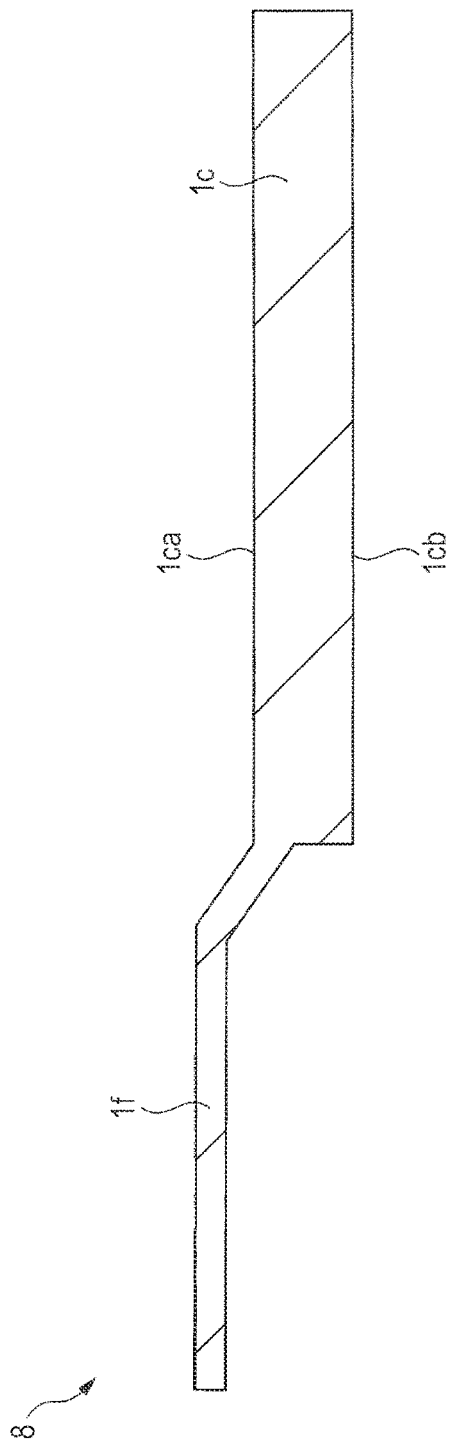
FIG. 7 is a sectional diagram illustrating one example of the structure cut along the A-A line in FIG. 6.

FIG. 6 is a partial plan view illustrating one example of a structure of main parts of a lead frame used for assembling the semiconductor device illustrated in FIG. 1 and FIG. 7 is a sectional diagram illustrating one example of the structure cut along the A-A line in FIG. 6.

First, a lead frame 8 of a type such as that illustrated in FIG. 6 and FIG. 7 is provided. A plurality of device regions 8a in each of which formation of one power device 5 illustrated in FIG. 1 is possible are formed on the lead frame 8. The chip mounting part 1c and the plurality of lead parts 1 which are arranged on the side (the vicinity, the circumference) of the chip mounting part 1c are formed in each device region 8a. In the lead frame 8 of the semiconductor device according to the present embodiment, one chip mounting part 1c which is almost square in the planar view and the two lead parts 1 and one suspension lead 1f which are arranged in correspondence with one side of the almost square chip mounting part 1c are included in one device region 8a.

Incidentally, the chip mounting part 1c has the upper surface (the second front surface) 1ca onto which the semiconductor chip 2 illustrated in FIG. 1 is to be mounted and the lower surface (the second rear surface) 1cb which is located on the opposite side of the upper surface 1ca.

In addition, an end of each of the respective lead parts 1 and the suspension lead 1f which is located on the opposite side of the chip mounting part 1c side thereof is linked with a frame part 8b and is supported by the frame part 8b. The chip mounting part 1c is supported by the suspension lead 1f which is linked with the frame part 8b.

Then, the wide part 1aa which is wide in lead width is formed on the chip mounting part 1c side end of each of the respective lead parts 1. The wide part 1aa is a region to which a wire is to be coupled.

Here, the lead frame 8 is made of a base material which contains, for example, copper (Cu) as the main component and a pattern illustrated in FIG. 6 is formed by etching working, press working and so forth.

2. Die Bonding

Figure 8:
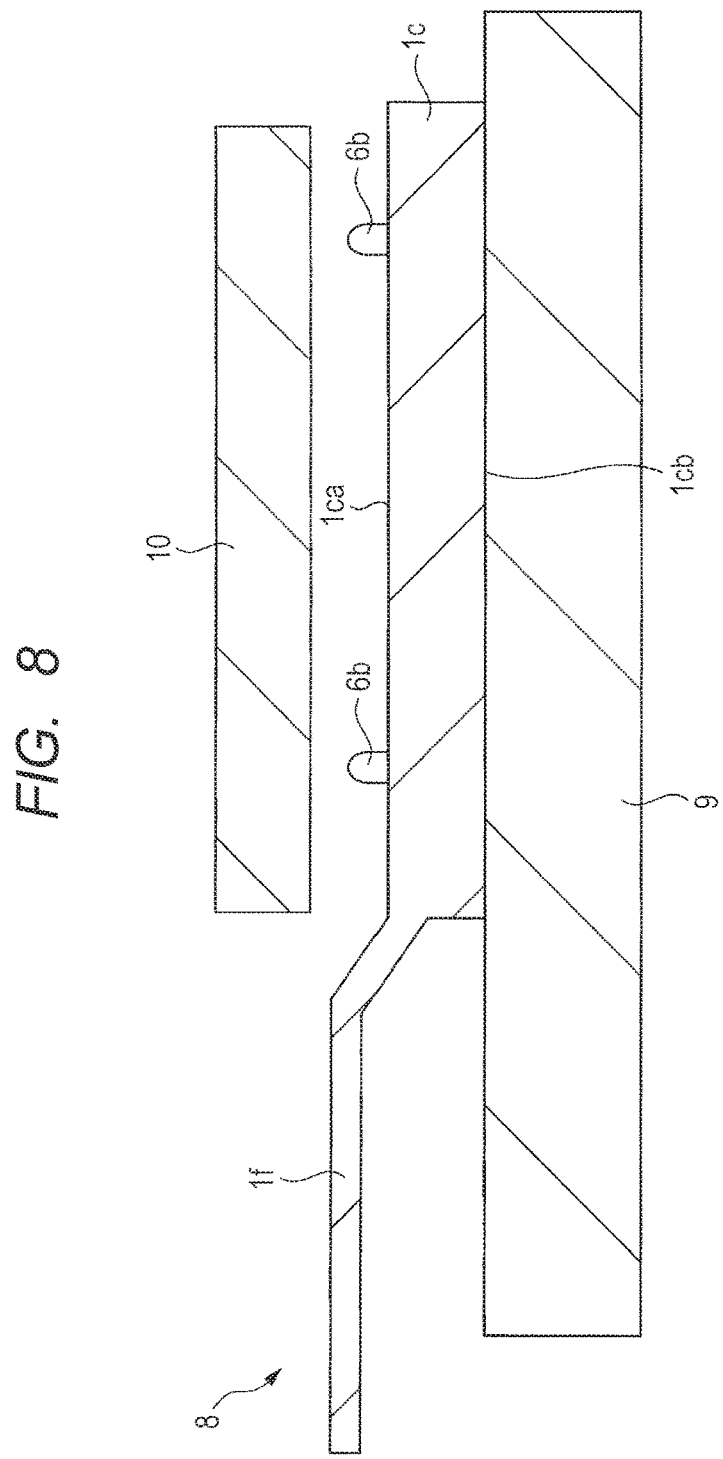
FIG. 8 is a sectional diagram illustrating one example of the step of applying a sintered-silver-use paste in a die bonding process for the semiconductor device illustrated in FIG. 1.
Figure 9:
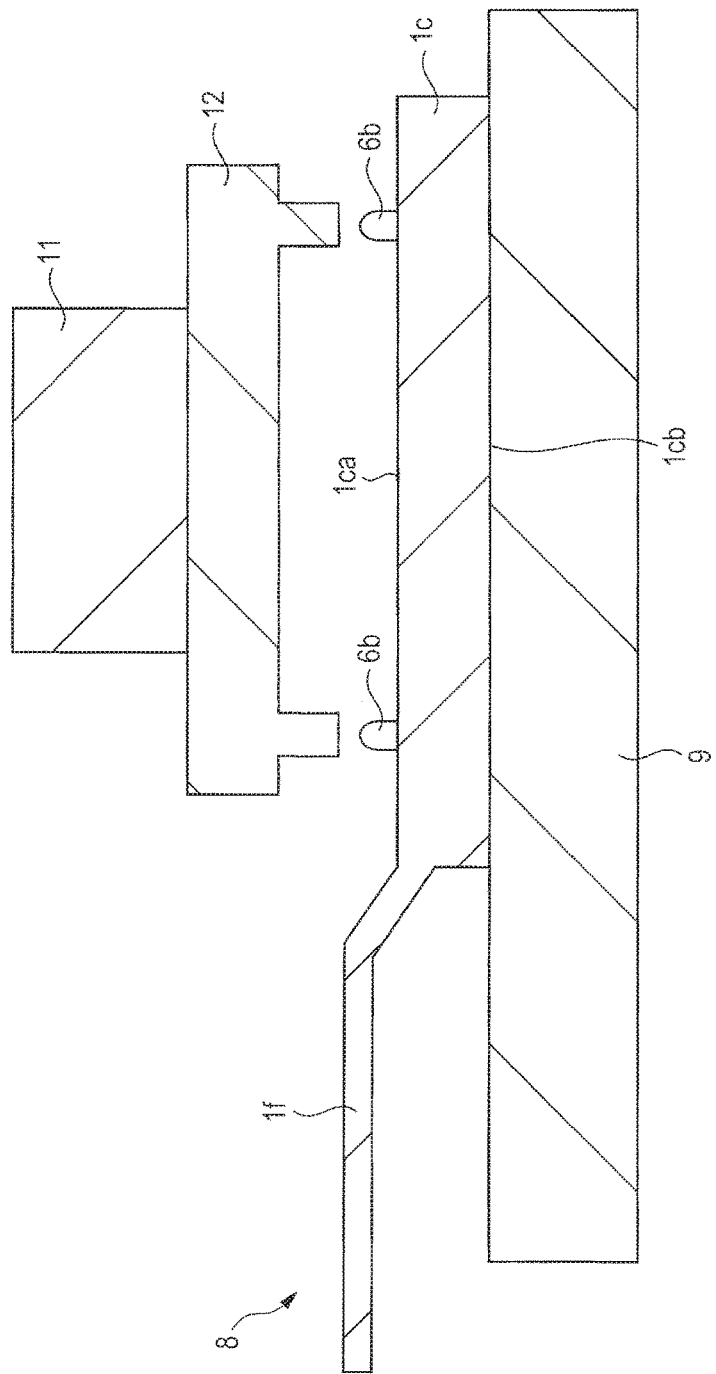
FIG. 9 is a sectional diagram illustrating a modified example of the step of applying the sintered-silver-use paste in the die bonding process for the semiconductor device illustrated in FIG. 1.
Figure 10:
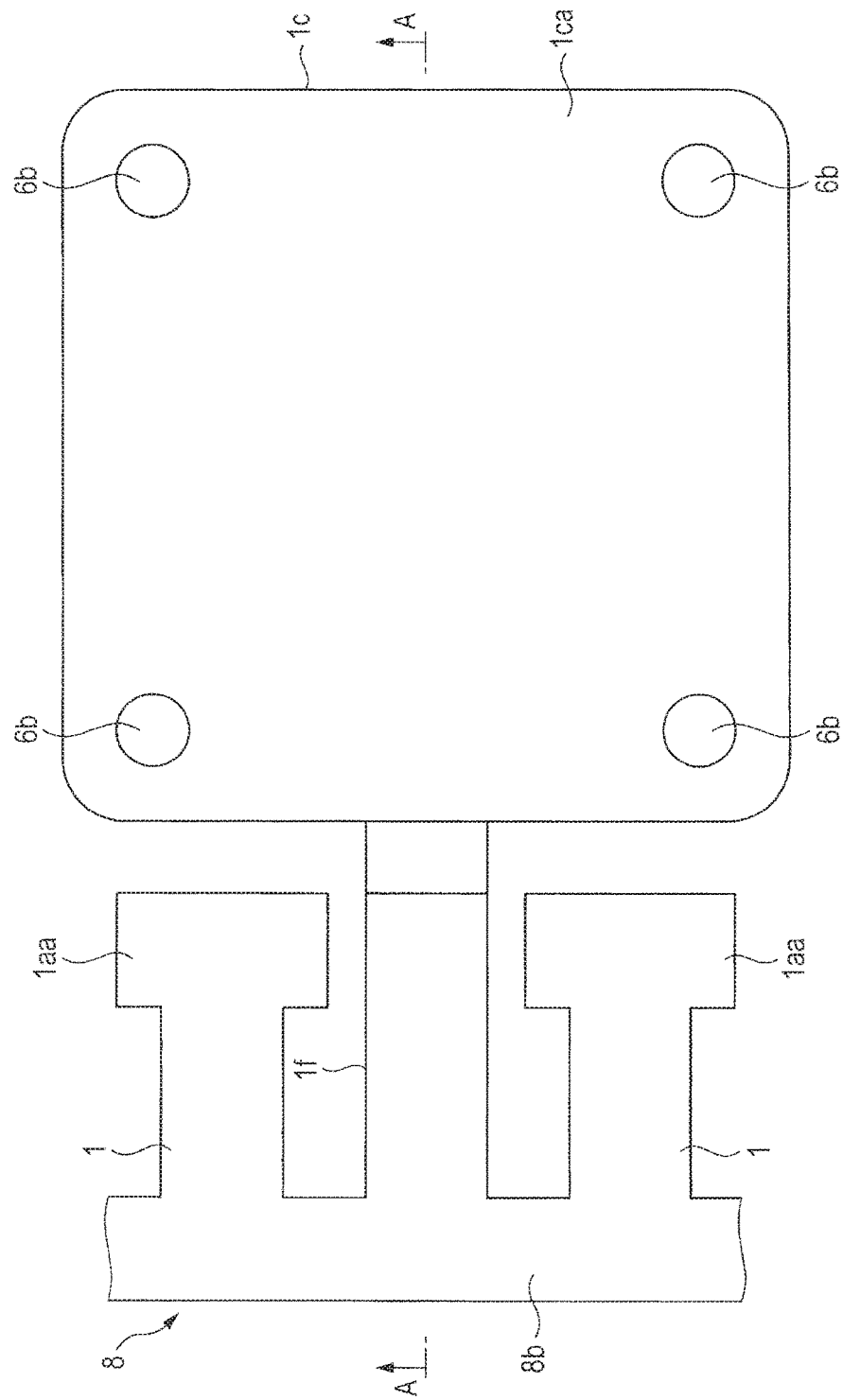
FIG. 10 is a partial plan view illustrating one example of a structure of the semiconductor device illustrated in FIG. 1 which is obtained after application of the sintered-silver-use paste in the die bonding process.
Figure 11:
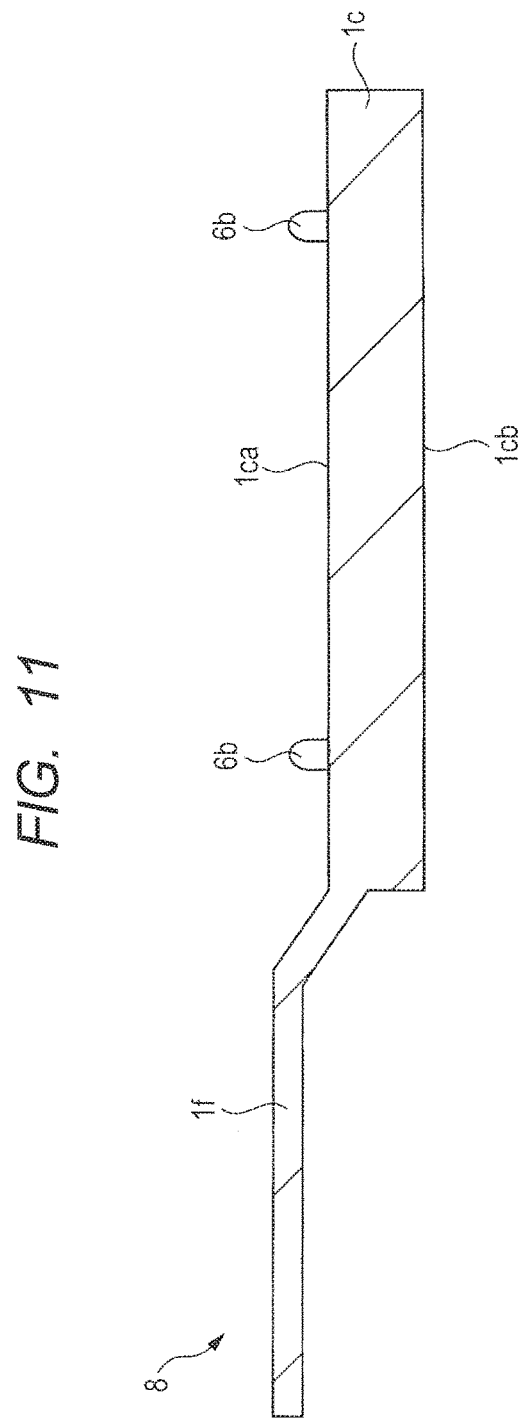
FIG. 11 is a sectional diagram illustrating one example of the structure cut along the A-A line in FIG. 10.

FIG. 8 is a sectional diagram illustrating one example of the step of applying the sintered-silver-use paste in a die bonding process for the semiconductor device illustrated in FIG. 1 and FIG. 9 is a sectional diagram illustrating a modified example of the step of applying the sintered-silver-use paste in the die bonding process for the semiconductor device illustrated in FIG. 1. In addition, FIG. 10 is a partial plan view illustrating one example of a structure of the semiconductor device illustrated in FIG. 1 which is obtained after application of the sintered-silver-use paste in the die bonding process and FIG. 11 is a sectional diagram illustrating one example of the structure cut along the A-A line in FIG. 10.

First, the semiconductor chip 2 such as that as illustrated in FIG. 1 and FIG. 2 is provided. Incidentally, the semiconductor chip 2 has the principal surface (the first front surface) 2a and the rear surface (the first rear surface) 2b which is located on the opposite side of the principal surface 2a. The source-use electrode pad 2c and the gate-use electrode pad 2d are exposed to the principal surface 2a. On the other hand, the drain-use electrode 2e which is the rear surface electrode is formed on/as the rear surface 2b.

Then, die bonding is performed after provision of the semiconductor chip 2 illustrated in FIG. 1 and the lead frame 8 illustrated in FIG. 6. In the present embodiment, the sintered silver (the first bonding material) 6 and the silver paste (the second bonding material) 7 are used as the die bonding materials for fixedly attaching the semiconductor chip 2 to the chip mounting part 1c. That is, the semiconductor chip 2 is die-bonded to the chip mounting part 1c with the sintered silver 6 which is arranged on the upper surface 1ca of the chip mounting part 1c of the lead frame 8 and the silver paste 7 which is also applied to the upper surface 1ca being interposed.

In the die bonding process, first, the sintered-silver-use paste (the first bonding material) 6b is applied to the upper surface 1ca of the chip mounting part 1c of the lead frame 8 as illustrated in FIG. 8. The sintered-silver-use paste 6b which is handled here is a pasted sintered silver material. That is, the sintered-silver-use paste 6b is the paste used for forming the sintered silver 6 and therefore will be still called the sintered-silver-use paste 6b also in the following. In addition, specifically, the sintered-silver-use paste 6b is applied to each of the plurality of first regions 1caa (see FIG. 21 which will be described later) as for the regions to which the sintered-silver-use paste 6b is to be applied. That is, the sintered-silver-use paste 6b is applied to each corner and its vicinity of the four corners of the upper surface 1ca of the chip mounting part 1c which is almost square in the planar view as illustrated in FIG. 10.

In this case, the sintered-silver-use paste 6b which is the pasted sintered silver material is applied to each corner and its vicinity of the chip mounting part 1c by, for example, screen printing. Specifically, the lead frame 8 is placed on a stage 9 as illustrated in FIG. 8 and the sintered-silver-use paste 6b is applied onto the upper surface 1ca of the chip mounting part 2c in this state by using a metal mask 10. In this case, the sintered-silver-use paste 6b is applied to each of the plurality of first regions 1caa on the upper surface 1ca of the chip mounting part 1c.

In addition, alternatively, the sintered-silver-use paste 6b may be applied onto the upper surface 1ca of the chip mounting part 1c of the lead frame 8 by using a shower nozzle (a multipoint nozzle) 12 as illustrated in FIG. 9. That is, the sintered-silver-use paste 6b is applied onto the upper surface 1ca of the chip mounting part 1c at multiple points by using the shower nozzle 12 which is attached to a syringe 11.

It is possible to efficiently apply the sintered-silver-use paste 6b to the plurality of first regions 1caa on the upper surface 1ca of the chip mounting part 1c by applying the sintered-silver-paste 6b onto the upper surface 1ca of the chip mounting part 1c at the multiple points by using the shower nozzle 12 in this way and thereby it is possible to improve productivity in mass production of the power device 5.

Further, the sintered-silver-use paste 6b may be applied onto the upper surface 1ca of the chip mounting part 1c by using a single-point nozzle 13 (see FIG. 12 which will be described later) as a modified example.

Incidentally, in the present embodiment, the sintered-silver-use paste 6b means a paste of the type that in a case where a volume ratio of silver before cured is 1, a volume ratio of the resin component is about 0.3 and therefore there exists almost no resin component after cured.

A structure obtained after application of the sintered-silver-use paste 6b is completed is illustrated in FIG. 10 and FIG. 11. The structure is in a state where the sintered-silver-use paste 6b is applied to each corner and its vicinity of the four corners (that is, the first regions 1caa which will be described later and the regions in each of which each of the four corners of the semiconductor chip 2 is to be arranged after mounting the semiconductor chip 4 in the step which will be performed later) of the upper surface 1ca of the chip mounting part 1c of the lead frame 8 as illustrated in FIG. 10.

The sintered-silver-use paste 6b is dried after application of the sintered-silver-use paste 6b.

The sintered-silver-use paste 6b is dried (baked) at, for example, about 120° C. Thereby, it becomes possible to reduce fluidity of the sintered-silver-use paste 6b. Incidentally, in assembly of the semiconductor device according to the present embodiment, it is preferable that the silver paste 7 be not applied before application of the sintered-silver-use paste 6b for the purpose of performing the step of drying the sintered-silver-use paste 6b.

It is possible to suppress a reduction in adhesiveness (stickiness) of the silver paste 7 to the semiconductor chip 2 which would occur when dried by drying the sintered-silver-use paste 6b before application of the silver paste 7. That is, although the reduction in adhesiveness of the silver paste 7 to the semiconductor chip 2 leads to occurrence of the positional displacement of the semiconductor chip 2, it becomes possible to suppress the reduction in adhesiveness of the silver paste 7 to the semiconductor chip 2 by drying the sintered-silver-use paste 6b before application of the silver paste 7 and thereby it becomes possible to reduce the occurrence of the positional displacement of the semiconductor chip 2.

Then, the silver paste 7 is applied to the chip mounting part 1c.

Figure 12:
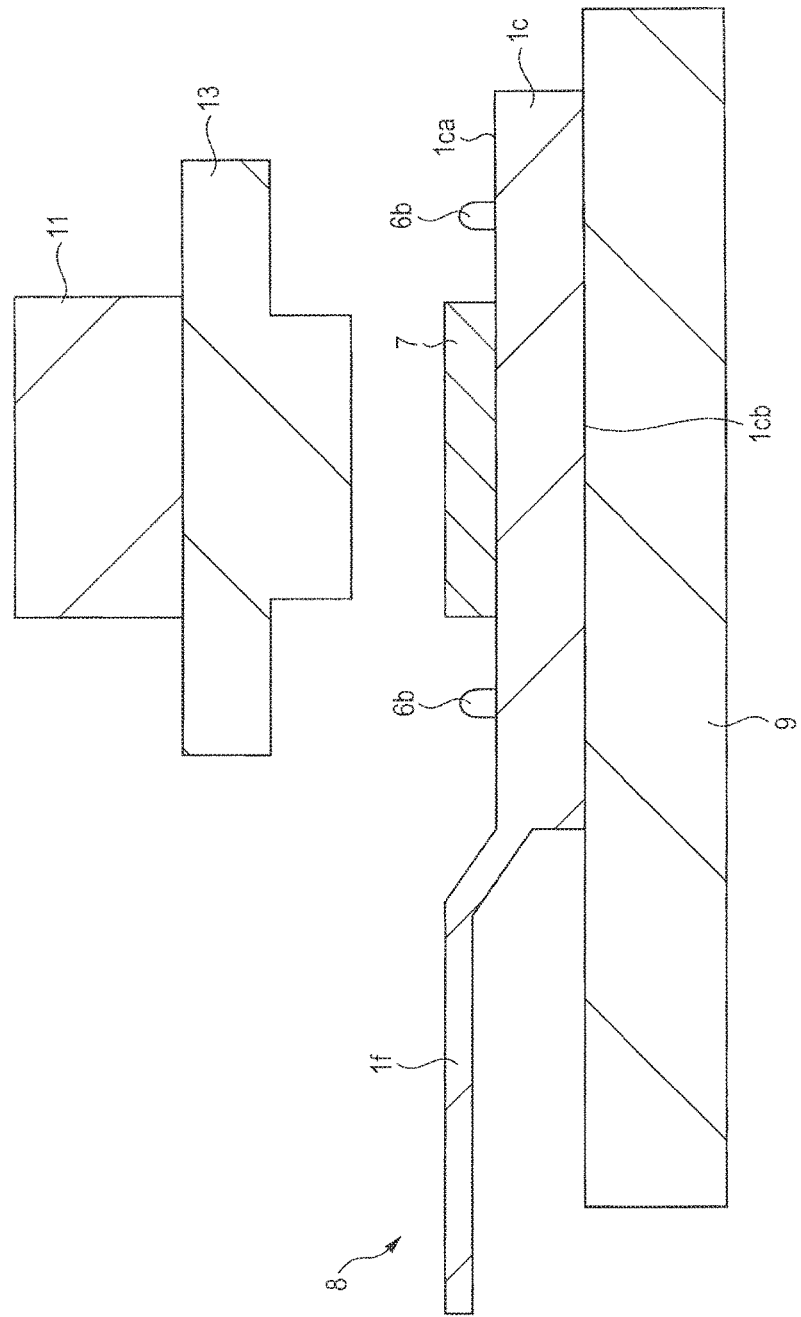
FIG. 12 is a sectional diagram illustrating one example of the step of applying a silver paste in the die bonding process for the semiconductor device illustrated in FIG. 1.
Figure 14:
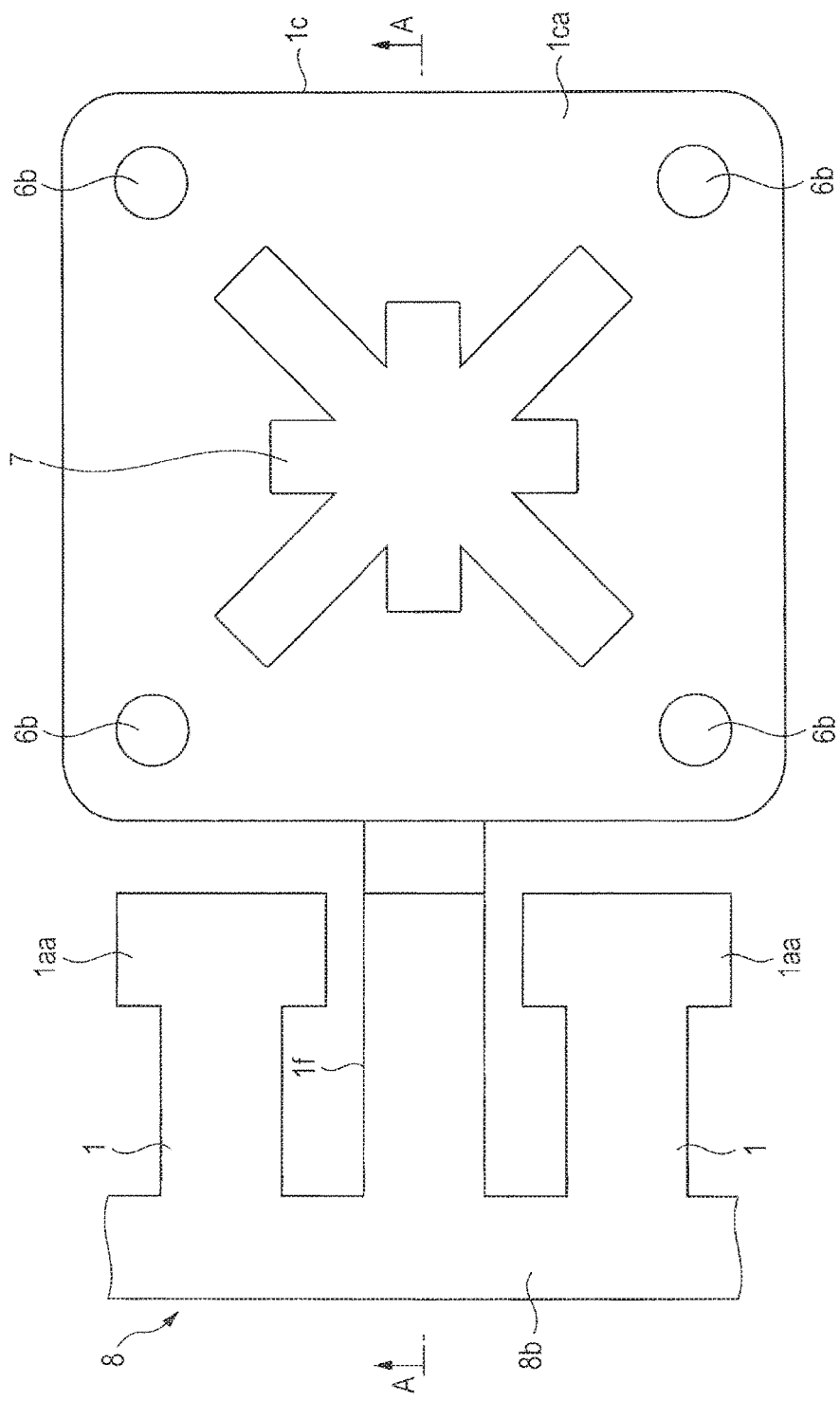
FIG. 14 is a partial plan view illustrating one example of a structure of the semiconductor device illustrated in FIG. 1 which is obtained after application of the silver paste in the die bonding process.
Figure 15:
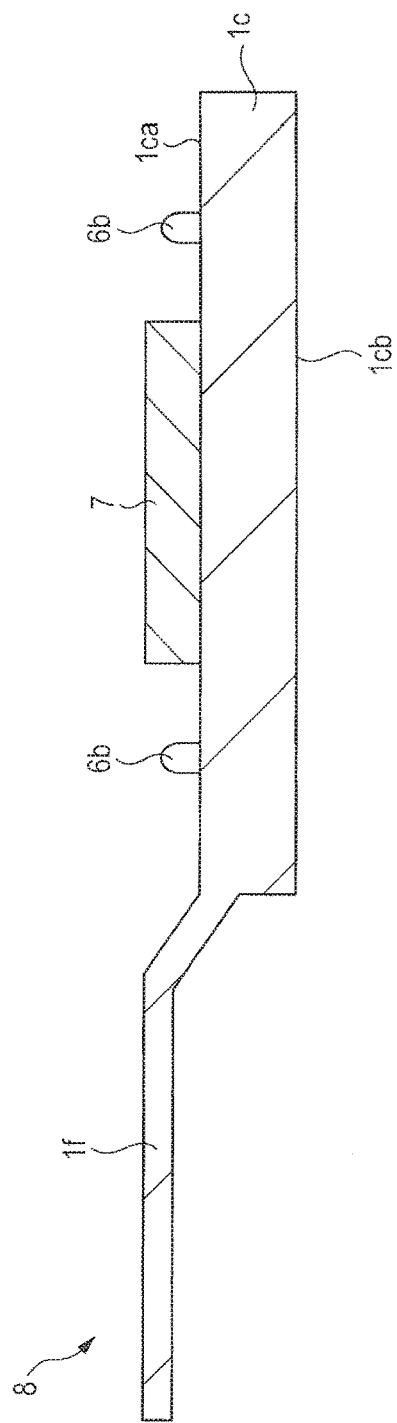
FIG. 15 is a sectional diagram illustrating one example of the structure cut along the A-A line in FIG. 14.

FIG. 12 is a sectional diagram illustrating one example of the step of applying the silver paste in the die bonding process for the semiconductor device illustrated in FIG. 1, FIG. 13 is a diagram illustrating one example of comparison in silver content between the sintered-silver-use paste and the silver paste used in the semiconductor device according to the present embodiment, FIG. 14 is a partial plan view illustrating one example of a structure of the semiconductor device illustrated in FIG. 1 which is obtained after application of the silver paste in the die bonding process and FIG. 15 is a sectional diagram illustrating one example of the structure cut along the A-A line in FIG. 14.

First, the chip mounting part 1c of the lead frame 8 is installed on the stage 9 and the silver paste 7 is applied onto the upper surface (the second front surface) 1ca of the chip mounting part 1c of the lead frame 8 by using the single-point 13 which is attached to the syringe 11 after installation of the chip mounting part 1c as illustrated in FIG. 12. The silver paste 7 is applied within a region which is defined by joining together four sintered-silver-use paste 6b applied regions as illustrated in FIG. 14. In other words, the silver paste 7 is applied to a central part and its vicinity of the chip mounting part 1c in the planar view. Describing in another way, the silver paste 7 is applied to the second region 1cab which is located between the plurality of respective first regions 1caa illustrated in FIG. 21 which will be described later (in the planar view, among the first regions 1caa as in FIG. 23 to FIG. 25).

In this case, the silver paste 7 may be applied to the second region 1cab by using the multipoint nozzle (the shower nozzle 12 illustrated in FIG. 9). In addition, an application amount of the silver paste 7 is large in comparison with the total application amount of the sintered-silver-use paste 6b which is applied to the four portions as illustrated in FIG. 14 and FIG. 15.

Incidentally, in the present embodiment, the silver (Ag) paste 7 means a paste of the type that in a case where a volume ratio of silver before cured is 1, a volume ratio of a resin component amounts to about 0.7 and in a case where the volume ratio of silver after cured is 1, the volume ratio of the resin component amounts to about 0.5.

In addition, it is also possible to compare the sintered-silver-use paste 6b with the silver paste 7 as illustrated in FIG. 13. That is, the silver paste 7 is 60 to 90 wt % and the sintered-silver-use paste 6b is at least 80 wt % in silver content. In addition, the silver paste 7 is up to 40 wt % and the sintered-silver-use paste 6b is up to 20 wt % in resin & solvent blending quantity.

Further, in a case where the silver paste 7 is compared with the sintered-silver-use paste 6b in void ratio (a ratio of voids per unit volume is expressed in percentage), a relation of the void ratio of the sintered-silver-use paste 6b>the void ratio of the silver paste 7 is established. Incidentally, in a case where the silver paste 7 is compared with the sintered-silver-use past 6b in porosity (a value obtained by averaging a ratio that pores occupy in an optional section of a bonding layer among the plurality of sections), a relation of the porosity of the sintered-silver-use paste 6b>the porosity of the silver paste 7 is established.

Then, the semiconductor chip 2 is mounted onto the chip mounting part 1c.

Figure 16:
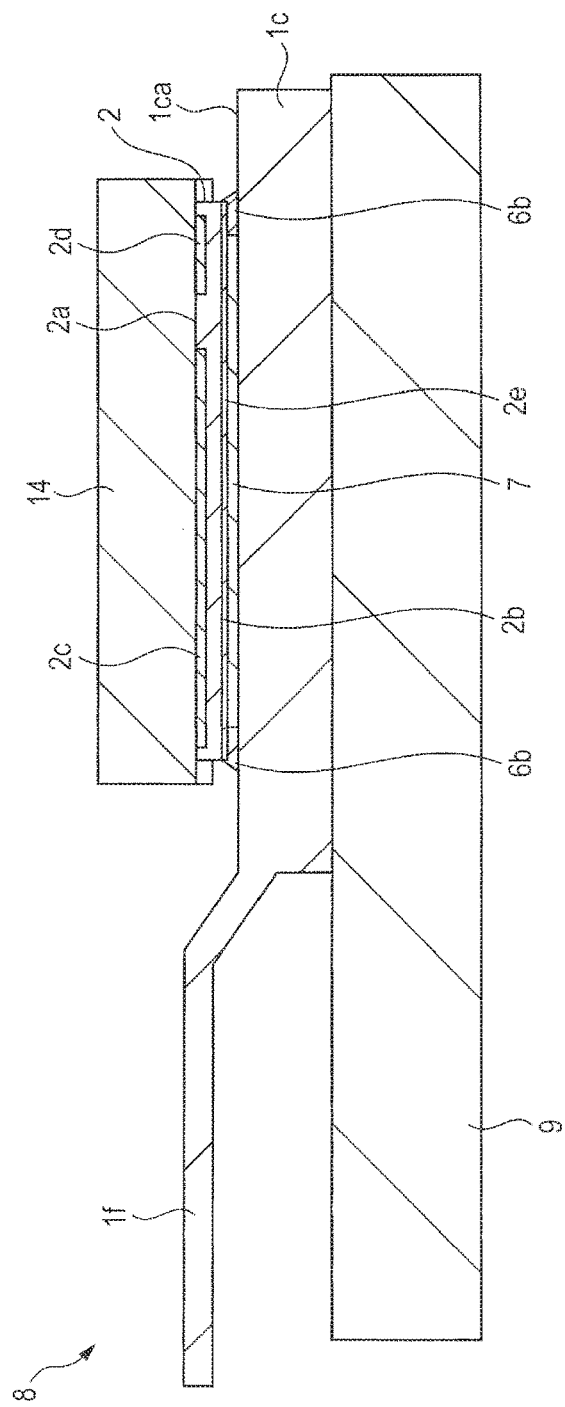
FIG. 16 is a sectional diagram illustrating one example of the chip installation (mounting) step in the die bonding process for the semiconductor device illustrated in FIG. 1.
Figure 17:
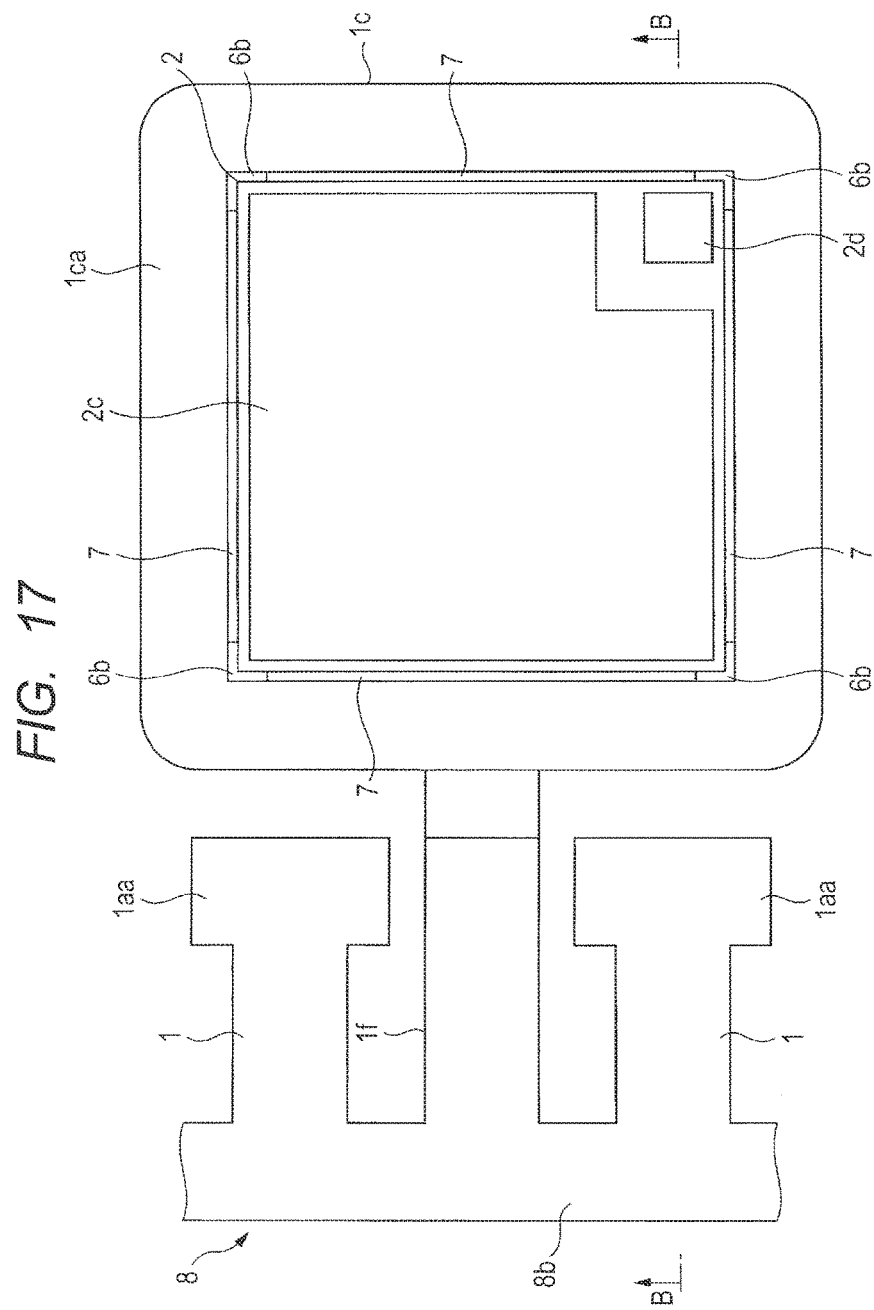
FIG. 17 is a partial plan view illustrating one example of a structure of the semiconductor device illustrated in FIG. 1 which is obtained after die-bonded.
Figure 19:
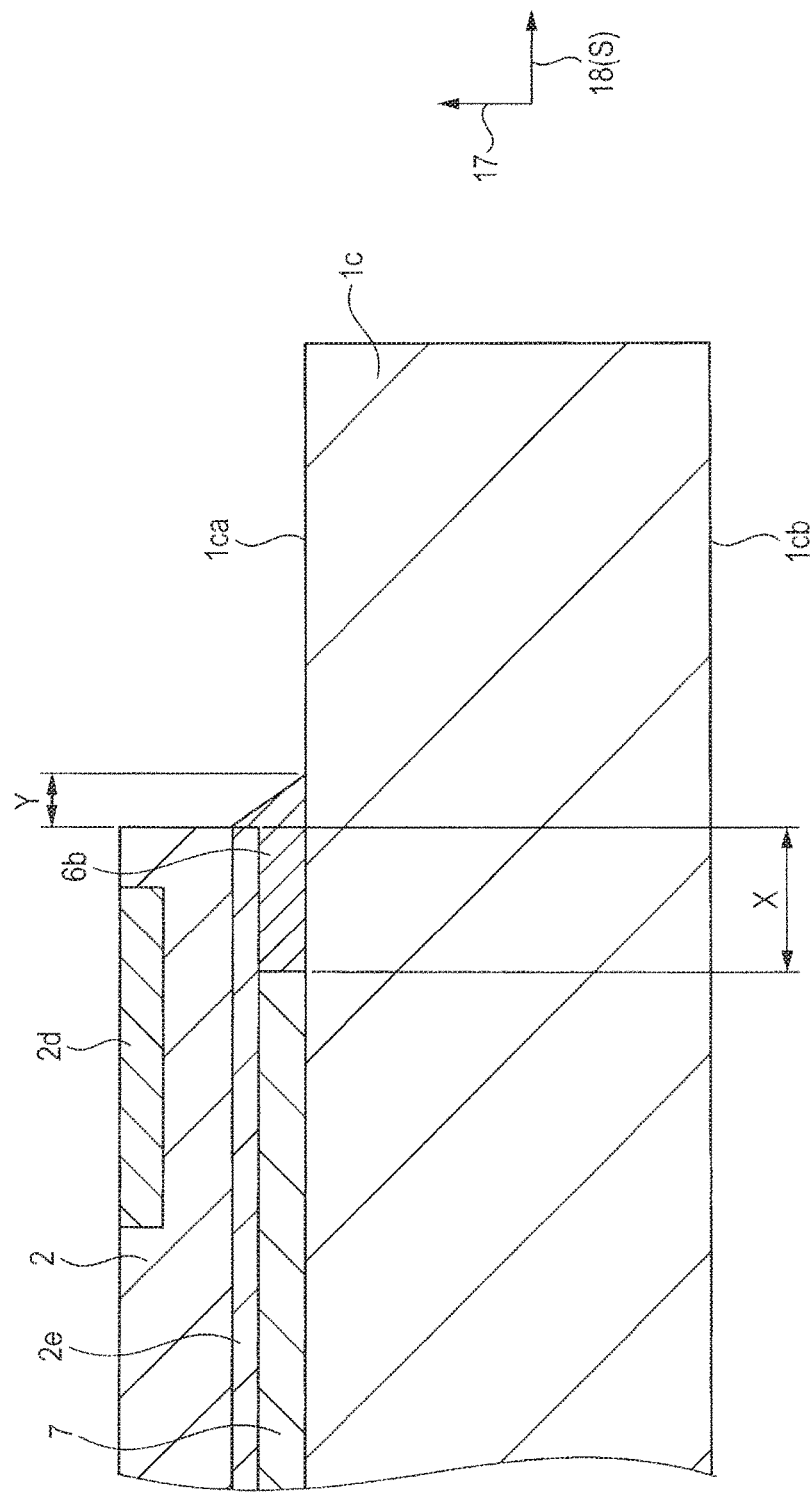
FIG. 19 is an enlarged partial sectional diagram illustrating one example of a structure of apart C in FIG. 18 in the enlarged state.

FIG. 16 is a sectional diagram illustrating one example of the chip installation step in the die bonding process for the semiconductor device illustrated in FIG. 1, FIG. 17 is a partial plan view illustrating one example of a structure of the semiconductor device illustrated in FIG. 1 which is obtained after die-bonded, FIG. 18 is a sectional diagram illustrating one example of the structure cut along the B-B line in FIG. 17 and FIG. 19 is an enlarged partial sectional diagram illustrating one example of a structure of a part C in FIG. 18 in the enlarged state.

Here, the semiconductor chip 2 is mounted onto the chip mounting part 1c by using a collet 14 as illustrated in FIG. 16. In this case, the semiconductor chip 2 is conveyed in a state of holding the semiconductor chip 2 by the collet 14 and thereafter the semiconductor chip 2 is mounted onto the chip mounting part 1c in such a manner that the rear surface 2b of the semiconductor chip 2 faces the upper surface 1ca of the chip mounting part 1c with the sintered-silver-use paste 6b and the silver paste 7 being interposed.

After mounting of the semiconductor chip 2, heat and pressure are applied to the semiconductor chip 2 and thereby the rear surface 2b of the semiconductor chip 2, and the sintered-silver-use paste 6b and the silver paste 7 are bonded together. Specifically, a load is applied to the collet 14 and the chip mounting part 1c of the lead frame 8, the sintered-silver-use paste 6b and the silver paste 7 are heated with heat from the stage 9 thereby to crimp the semiconductor chip 2 to the chip mounting part 1c. Then, a temperature of the heat which is generated from the stage 9 in this case is, for example, about 250° C. which is high in comparison with a heating temperature (for example, 120° C.) applied when drying the sintered-silver-use paste 6b. Further, the sintered-silver-use paste 6b is further cured by being heated at 250° C.

Incidentally, the load may be applied to the semiconductor chip 2 by using a block material and so forth other than the collet 14.

Here, a positional relation of the sintered-silver-use paste 6b to the semiconductor chip 2 will be described by using the plan view in FIG. 17 and the sectional diagrams in FIG. 18 and FIG. 19.

It is assumed that a length of an embedded portion (a first portion which is sandwiched between the semiconductor chip 2 and the chip mounting part 1c) of the sintered-silver-use paste 6b in a horizontal direction S is X and a length of a protruding portion (a second portion) of the sintered-silver-use paste 6b which protrudes from the semiconductor chip 2 in the horizontal direction S is Y. Then, in a case where the length X is compared with the length Y, a case where X>Y is established is more preferable than a case where X<Y is established. In the case where X>Y is established, an area over which the semiconductor chip 2 and the sintered-silver-use paste 6b are bonded together directly under each corner of the semiconductor chip 2 is increased and thereby it is possible to increase a bonding strength of a portion directly under each corner of the semiconductor chip 2. Consequently, even in a case where the stress is largely applied to the portion directly under each corner of the semiconductor chip 2, it is possible to increase resistance to the stress.

Further, the above-described embedded portion (the first portion) X and the above-described protruding portion (the second portion) Y will be described in more detail.

Figure 20:
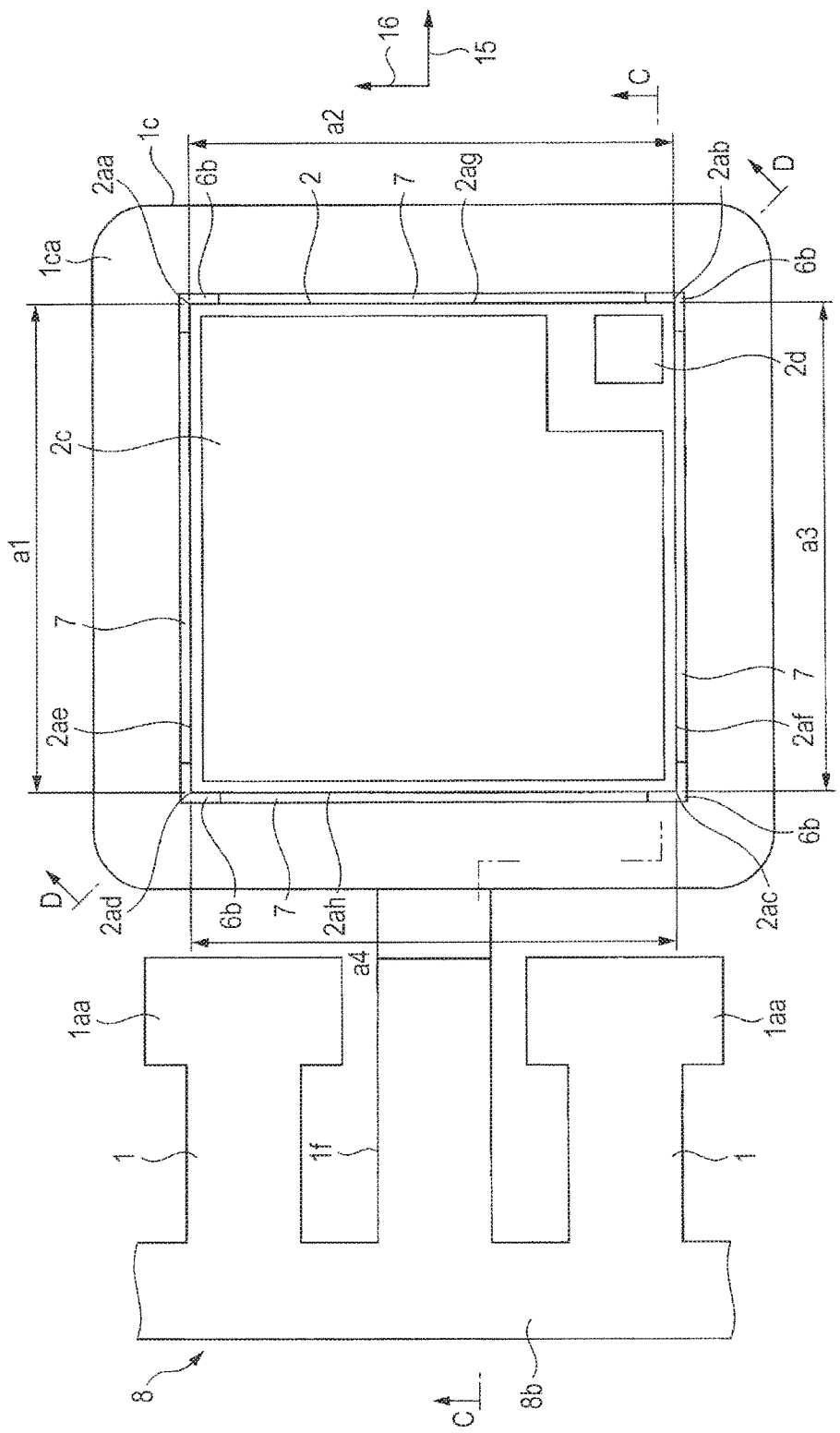
FIG. 20 is a partial plan view illustrating one example of a structure of the semiconductor device illustrated in FIG. 1 which is obtained after die-bonded.
Figure 21:
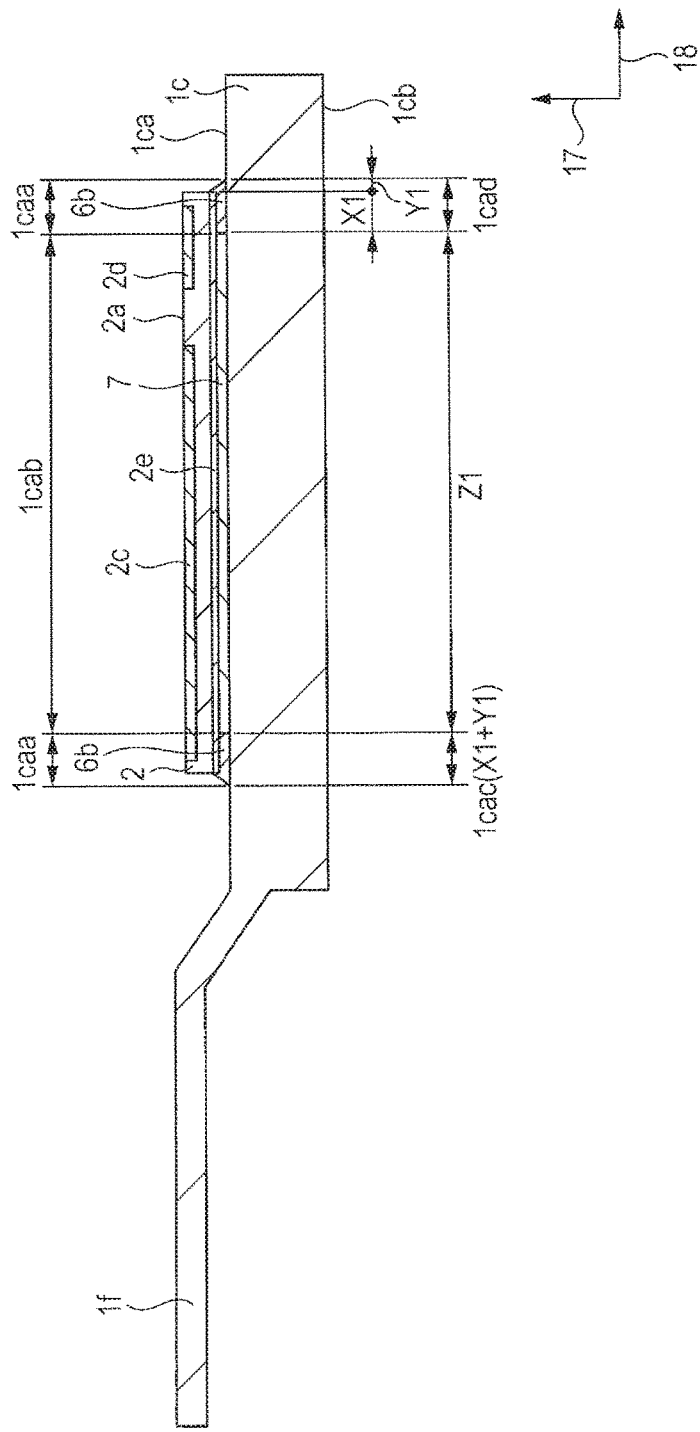
FIG. 21 is a sectional diagram illustrating one example of the structure cut along the C-C line in FIG. 20.
Figure 22:
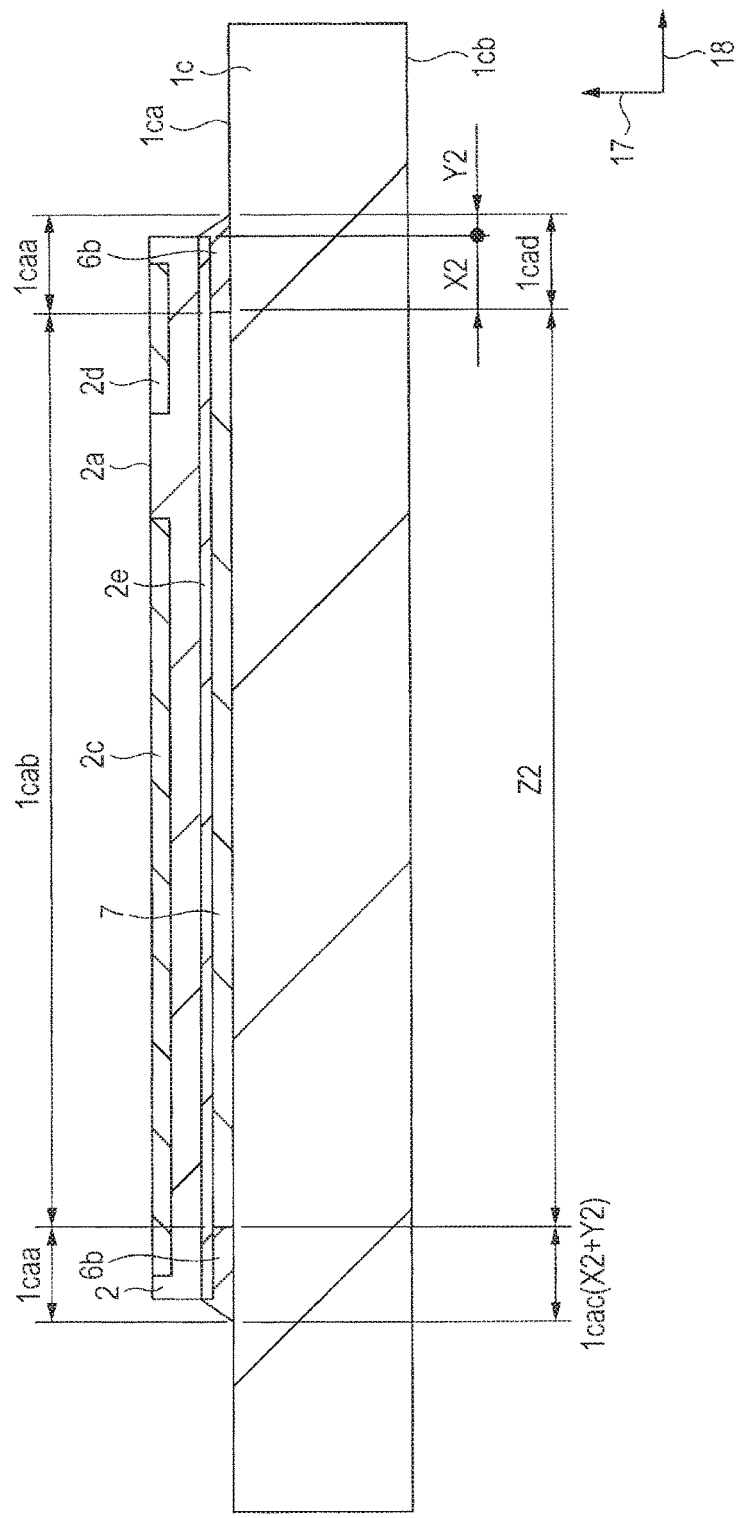
FIG. 22 is a sectional diagram illustrating one example of the structure cut along the D-D line in FIG. 20.

FIG. 20 is a partial plan view illustrating one example of a structure of the semiconductor device illustrated in FIG. 1 which is obtained after die-bonded, FIG. 21 is a sectional diagram illustrating one example of the structure cut along the C-C line in FIG. 20 and FIG. 22 is a sectional diagram illustrating one example of the structure cut along the D-D line in FIG. 20.

First, a definition of a positional relation of the semiconductor chip 2 to the chip mounting part 1c will be described by using the plan view illustrated in FIG. 20. The semiconductor chip 2 has a first side 2ae which extends in a first direction 15, a second side 2af which is located on the opposite side of the first side 2ae and extends in the first direction 15, a third side 2ag which extends in a second direction 16 which intersects the first direction 15 and a fourth side 2ah which is located on the opposite side of the third side 2ag and extends in the second direction 16 in the planar view.

Further, the semiconductor chip 2 has a first corner 2aa at which the first side 2aa and the third side 2ag intersect each other, a second corner 2ab at which the third side 2ag and the second side 2af intersect each other, a third corner 2ac at which the second side 2af and the fourth side 2ah intersect each other and a fourth corner 2ad at which the fourth side 2ah and the first side 2ae intersect each other in the planar view.

Then, in the structure which is illustrated in FIG. 20 and that the semiconductor chip 2 is mounted onto the chip mounting part 1c, part of each of the first corner 2aa, the second corner 2ab, the third corner 2ac and the fourth corner 2ad is located in each of the plurality of first regions 1caa (a region (X1+Y1) illustrated in FIG. 21).

Describing in detail, when looking at the sectional diagram (FIG. 21) along the C-C line (the line along the side) in FIG. 20 and the sectional diagram (FIG. 22) along the D-D line (the diagonal line) in FIG. 20, it is possible to express the respective regions as follows.

First, in FIG. 21 which is the sectional diagram along the side of the semiconductor chip 2, a rim region of the semiconductor chip 2=a sintered-silver-use paste 6b applied region=the region (X1+Y1)=the first region 1caa. Then, a silver paste 7 applied region=a region Z1=the second region 1cab.

In addition, in FIG. 22 which is the sectional diagram along the diagonal line of the semiconductor chip 2, the rim region of the semiconductor chip 2=the sintered-silver-use paste 6b applied region=a region (X2+Y2)=the first region 1caa. Then, the silver paste 7 applied region=a region Z2=the second region 1cab.

That is, the relations X1>Y1 and X2>Y2 are satisfied in both of the sectional structure along the side of the semiconductor chip 2 and the sectional structure along the diagonal line of the semiconductor chip 2.

In addition, it is preferable that Z1>2×(X1+Y1) and Z2>2×(X2+Y2) be established from the viewpoint of obtaining the adhesiveness of the semiconductor chip 2. Further, it is preferable that a silver paste 7 applied area>a sintered-silver-use paste 6b applied area be established.

In the sectional structure (FIG. 21) along the side of the semiconductor chip 2 and the sectional structure (FIG. 22) along the diagonal line of the semiconductor chip 2, the central region (the center region) of the semiconductor chip 2 is a region which overlaps the silver paste 7 applied region (the second region 1cab) in the present embodiment.

In addition, in the sectional structure (FIG. 21) along the side of the semiconductor chip 2 and the sectional structure (FIG. 22) along the diagonal line of the semiconductor chip 2, the rim region (the corner region) of the semiconductor chip 2 is a region which overlaps the sintered-silver-use paste 6b applied region (the first region 1caa).

Then, in the planar structure illustrated in FIG. 20, part of the corner (the first corner 2aa) that a side a1 (the first side 2aa) and a side a2 (the third side 2ag) of the semiconductor chip 2 form is located in the sintered-silver-use paste 6b applied region (the first region 1caa on the upper right side). Likewise, part of the corner (the second corner 2ab) that the side a2 (the third side 2a) and a side a3 (the second side 2af) of the semiconductor chip 2 form and part of the corner (the third corner 2ac) that the side a3 (the second side 2af) and a side a4 (the fourth side 2ah) of the semiconductor chip 2 form are located in the plurality of sintered-silver-use paste applied regions (the first regions 1caa on the lower right side and the lower left side) in the planar view. Likewise, part of the corner (the fourth corner 2ad) that the side a4 (the fourth side 2ab) and the side a1 (the first side 2ae) of the semiconductor chip 2 form is located in the sintered-silver-use paste applied region (the first regions 1caa on the upper left side).

Figure 23:
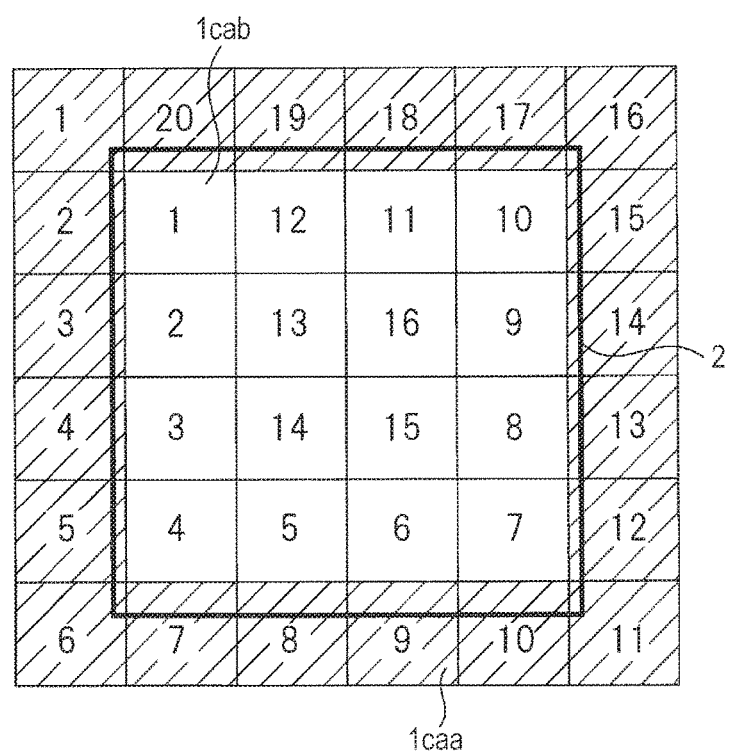
FIG. 23 is a first conceptual diagram illustrating one example of a relation among a semiconductor chip, a silver paste applied region and a sintered-silver-use paste applied region in the structure illustrated in FIG. 20.

Incidentally, conceptual diagrams as follows are conceived on the basis of a way of thinking that part of each of the plurality of corners of the semiconductor chip 2 is arranged in each sintered-silver-use paste 6b applied region in the planar view. FIG. 23 is a first conceptual diagram illustrating one example of a relation among the semiconductor chip 2, silver paste 7 applied regions and sintered-silver-use paste 6b applied regions in the structure illustrated in FIG. 20, FIG. 24 is a second conceptual diagram illustrating one example of the relation among the semiconductor chip 2, the silver paste 7 applied regions and the sintered-silver-use paste 6b applied regions in the structure illustrated in FIG. 20 and FIG. 25 is a conceptual diagram illustrating a modified example of the relation among the semiconductor chip 2, the silver paste 7 applied regions and the sintered-silver-use paste 6b applied regions illustrated in FIG. 23.

Figure 24:
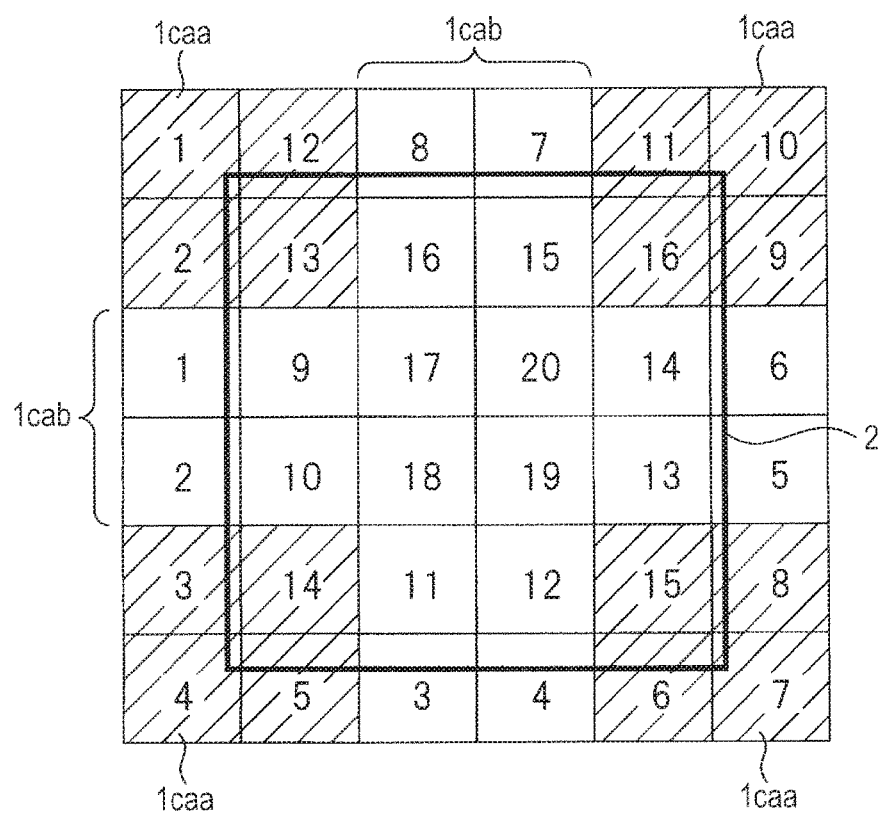
FIG. 24 is a second conceptual diagram illustrating one example of the relation among the semiconductor chip, the silver paste applied region and the sintered-silver-use paste applied region in the structure illustrated in FIG. 20.
Figure 25:
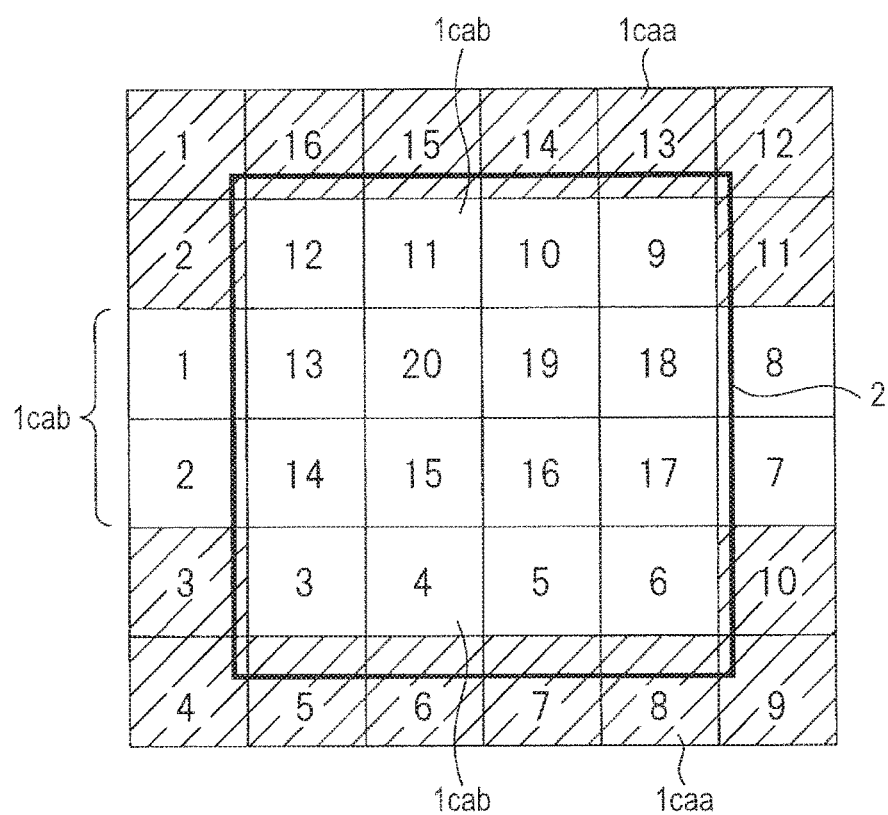
FIG. 25 is a conceptual diagram illustrating a modified example of the relation among the semiconductor chip, the silver paste applied region and the sintered-silver-use paste applied region illustrated in FIG. 23.

In FIG. 23 to FIG. 25, the sintered-silver-use paste 6b applied regions are hatched and the silver paste 7 applied regions are not hatched (blank regions).

Here, in a case of the first conceptual diagram illustrated in FIG. 23, the sintered-silver-use paste 6b is applied to any of hatched outer circumference regions 1 to 20 and thereafter the silver paste 7 is pressed by the semiconductor chip 2 in such a manner that the silver paste 7 fluidizes and wets and spreads to a region (any of not-hatched central regions 1 to 16) which is located under the semiconductor chip 2. This means that a destination to which the silver paste 7 wets and spreads is limited (defined) by the sintered-silver-use paste 6b and therefore a risk that the silver paste 7 would insufficiently wet and spread (=generation of the voids) is increased. That is, it is feared that the voids may generate.

Accordingly, part of each of the plurality of corners of the semiconductor chip 2 is arranged on each group of the sintered-silver-use paste 6b applied regions (hatched corner regions 1 to 16) in the planar view as in the second conceptual diagram illustrated in FIG. 24. The plurality of sintered-silver-use paste 6b applied regions (the hatched corner regions 1 to 16) are brought into mutually independent (isolated) states by the silver paste 7 applied regions (the not-hatched regions 1 to 20) per group in the structure illustrated in FIG. 24. Thereby, it is possible to suppress generation of the voids in comparison with the structure in the first conceptual diagram in FIG. 23.

Incidentally, the structure in the conceptual diagram illustrated in FIG. 25 is conceivable as one modified example of the structure in the first conceptual diagram illustrated in FIG. 23. However, since it is imagined that the voids may generate on any two mutually facing sides in the four sides of the semiconductor chip 2 similarly to the structure in the first conceptual diagram in FIG. 23, the modified example illustrated in FIG. 25 is not preferable. That is, the destination to which the silver paste 7 wets and spreads is limited (defined) by the sintered-silver-use paste 6b on any two mutually facing sides in the four sides of the semiconductor chip 2 and therefore it is feared that the voids may generate.

As described above, in a relation between the sintered-silver-use paste 6b applied regions and the silver paste 7 applied region, the structure that the plurality of sintered-silver-use paste 6b applied regions are brought into mutually independent (isolated) states per group by the silver paste 7 applied regions as in the case in the second conceptual diagram illustrated in FIG. 24 is preferable. However, the structure in the first conceptual diagram illustrated in FIG. 23 and the structure of the modified example of the first conceptual diagram which is illustrated in FIG. 25 may be adopted.

Here, in the relation between the sintered-silver-use paste 6b applied regions configured by the plurality of first regions 1caa and the silver paste 7 applied regions which configure the second region 1cab, it is preferable that the sum of areas of the plurality of first regions 1caa be smaller than an area of the second region 1cab in the planar view. For example, the structure illustrated in FIG. 24 or the structure illustrated in FIG. 25 is preferable.

The above-described content may be expressed in another way. For example, as illustrated in FIG. 21 and FIG. 22, the second region 1cab is located between a third region 1cac included in the plurality of first regions 1caa and a fourth region 1cad included in the plurality of first regions 1caa in a sectional view in a third direction 17 directing from the lower surface 1cb of the chip mounting part 1c toward the principal surface 2a of the semiconductor chip 2 and in a fourth direction 18 which is vertical to the third direction 17. That is, the second region 1cab is located between the third region 1cac in the plurality of first regions 1caa and the fourth region 1cad in the plurality of first regions 1caa. Then, the length Z1 (or Z2) of the second region 1cab in the fourth direction 18 is larger than the sum of a length of the third region 1cac in the fourth direction 18 and a length of the fourth region 1cad in the fourth direction 18. That is, $(X1+Y1)+(X1-Y1)<Z1$ and $(X2+Y2)+(X2+Y2)<Z2$.

In addition, in the sectional view in the third direction 17 directing from the lower surface 1cb of the chip mounting part 1c toward the principal surface 2a of the semiconductor chip 2, the sintered-silver-use paste 6b which is applied to each of the plurality of first regions 1caa (see FIG. 21) in the planar view illustrated in FIG. 20 has the first portion X which is sandwiched between the semiconductor chip 2 and the chip mounting part 1c in the third direction 17 as illustrated in FIG. 19. Further, the sintered-silver-use paste 6b has the second portion Y which is not sandwiched between the semiconductor chip 2 and the chip mounting part 1c in the third direction 17. That is, the sintered-silver-use paste 6b has the first portion X and the second portion Y. Then, it is preferable that the length of the first portion X in the fourth direction (S) 18 which is vertical to the third direction 17 be larger than the length of the second portion Y in the fourth direction (S) 18. That is, X>Y is preferable. Thereby, since the area over which the semiconductor chip 2 and the sintered-silver-use paste 6b are bonded together directly under each corner thereof is increased, it is possible to increase the bonding strength of the portion directly under each corner of the semiconductor chip 2.

The die bonding process is completed in the above-described way. That is, the rear surface 2b of the semiconductor chip 2 is brought into a state of being fixedly attached to the upper surface 1ca of the chip mounting part 1c with the sintered silver 6 and the silver paste 7. Incidentally, since the sintered-silver-use paste 6b is cured by being heated in the die bonding process, the sintered-silver-use paste 6b will be called the sintered silver 6 in an assembling process which comes after the die bonding process.

3. Wire Bonding

Figure 26:
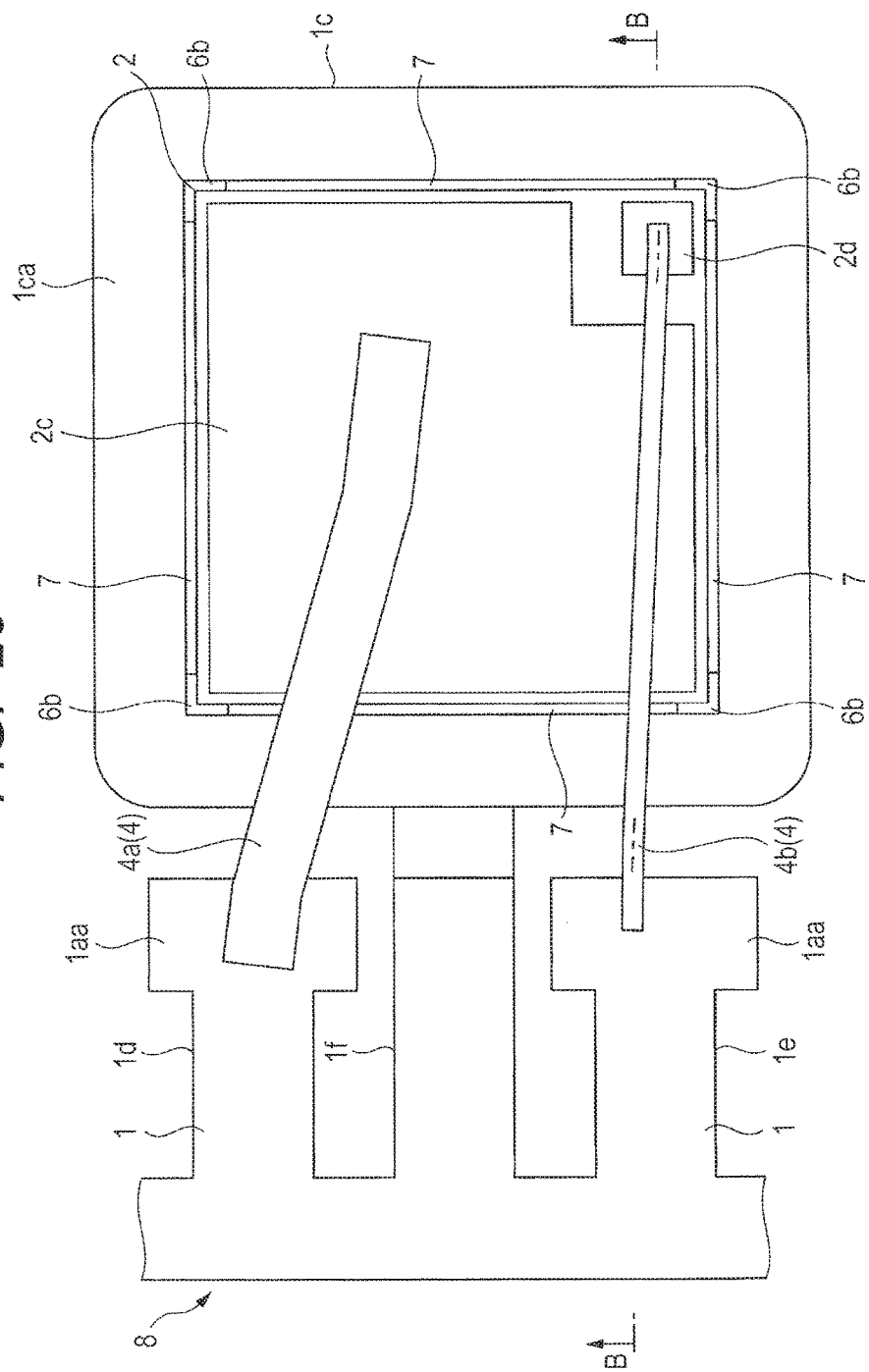
FIG. 26 is a partial plan view illustrating one example of a structure of the semiconductor device illustrated in FIG. 1 which is obtained after wire-bonded.
Figure 27:
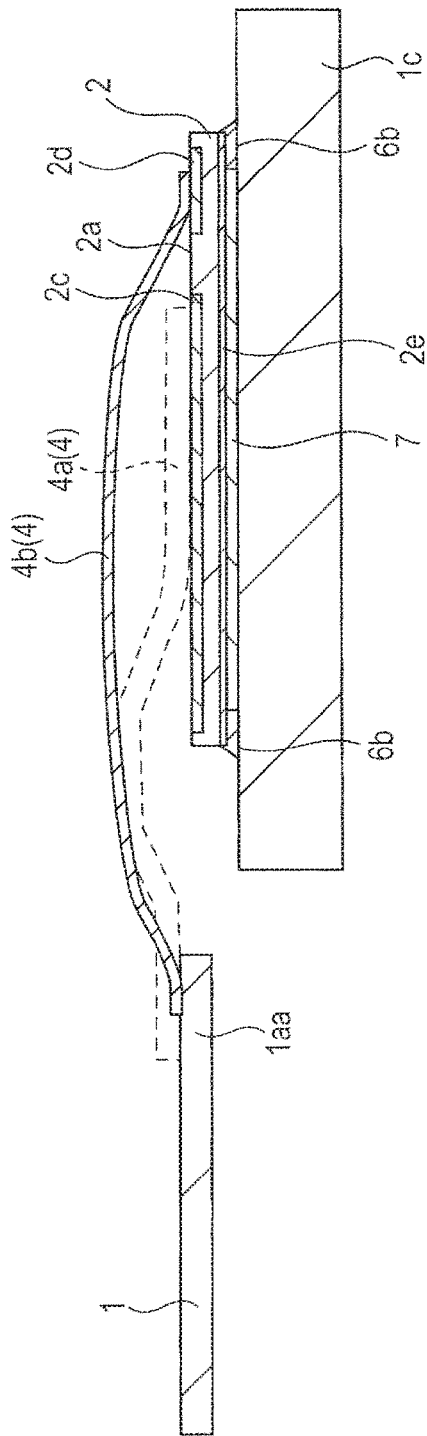
FIG. 27 is a sectional diagram illustrating one example of the structure cut along the B-B line in FIG. 26.

FIG. 26 is a partial plan view illustrating one example of a structure of the semiconductor device illustrated in FIG. 1 which is obtained after wire-bonded and FIG. 27 is a sectional diagram illustrating one example of the structure cut along the B-B line in FIG. 26.

Wire bonding is performed as illustrated in FIG. 26 and FIG. 27 after completion of the die bonding process. Here, the source-use electrode pad 2c on the principal surface 2a of the semiconductor chip 2 and the wide part 1aa of the source lead 1d are electrically coupled to each other by the Al wire 4a which is the source wire and the gate-use electrode pad 2d on the principal surface 2a of the semiconductor chip 2 and the wide part 1aa of the gate lead 1e are electrically coupled to each other by the Al wire 4b which is the gate wire and is smaller than the Al wire 4a in wire diameter.

In this case, the wire bonding is performed in the order of the source wire and the gate wire. That is, first, the source-use electrode pad 2c of the semiconductor chip 2 and the source lead 1d are electrically coupled to each other by the Al wire 4a which is large in wire diameter and then the gate-use electrode pad 2d of the semiconductor chip 2 and the gate lead 1e are electrically coupled to each other by the Al wire 4b which is small in wire diameter.

The Al wires 4a and 4b are meal wires which contain aluminum (Al) as the main components respectively. On the other hand, metal wires which contain copper (Cu) or gold (Au) as the main components may be used as the source wire and the gate wire respectively. Further, the source wire is large in wire diameter in order to reduce ON resistance. The wire diameter of the source wire is larger than the wire diameter of, for example, the gate wire.

4. Resin Sealing (Resin Molding)

Figure 28:
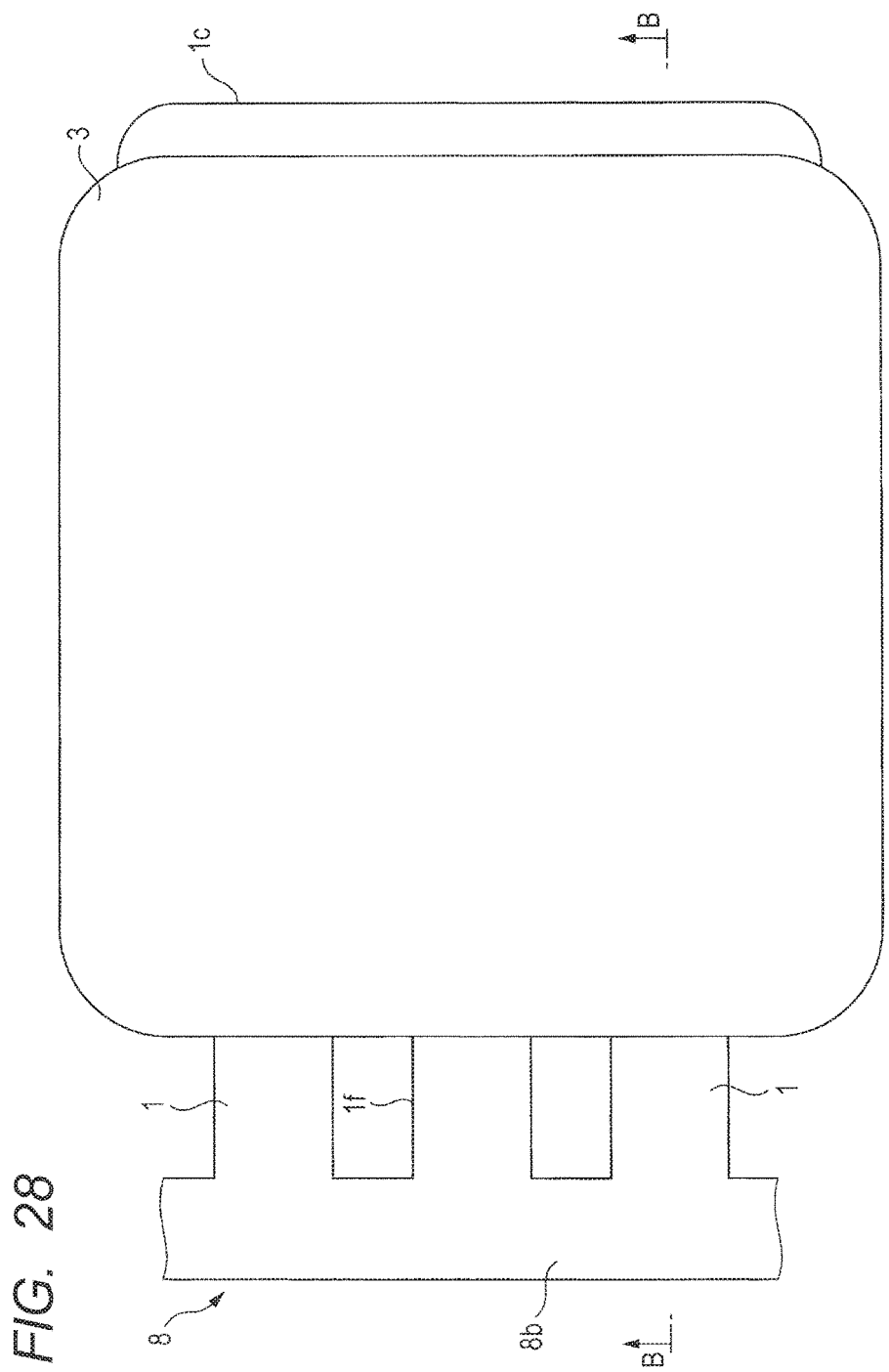
FIG. 28 is a partial plan view illustrating one example of a structure of the semiconductor device illustrated in FIG. 1 which is obtained after resin-molded.
Figure 29:
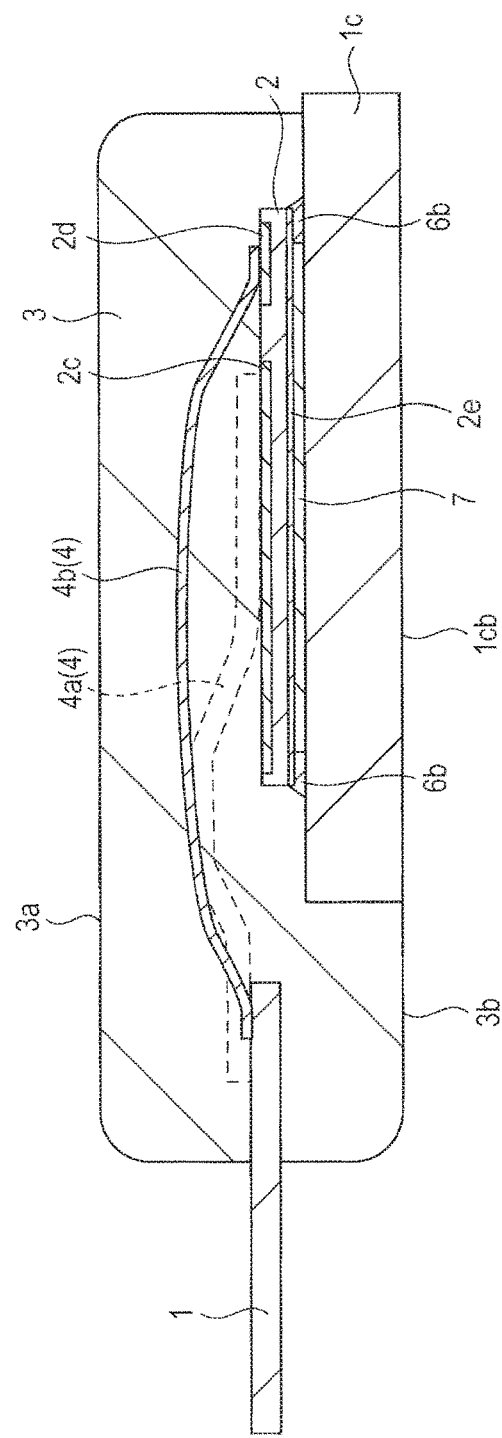
FIG. 29 is a sectional diagram illustrating one example of the structure cut along the B-B line in FIG. 28.

FIG. 28 is a partial plan view illustrating one example of a structure of the semiconductor device illustrated in FIG. 1 which is obtained after resin-molded (sealed) and FIG. 29 is a sectional diagram illustrating one example of the structure cut along the B-B line in FIG. 28.

Resin sealing (molding) is performed as illustrated in FIG. 28 and FIG. 29 after wire-bonded. Here, the sealing body 3 which covers at least part of the semiconductor chip 2 and part of the chip mounting part 1c and has the upper surface 3a and the lower surface 3b which is located on the opposite side of the upper surface 3a is formed. That is, the sealing body 3 is formed in such a manner that the lower surface 1cb of the chip mounting part 1c is exposed to the lower surface 3b of the sealing body 3. Then, part of each of the semiconductor chip 2, the AL wires 4 such as the source wire and the gate wire and so forth, and then the chip mounting part 1c, the source lead 1d and the gate lead 1e is sealed with a sealing resin.

Incidentally, the sealing resin is configured by a thermoplastic resin such as, for example, an epoxy resin and so forth.

5. Plating

Figure 30:
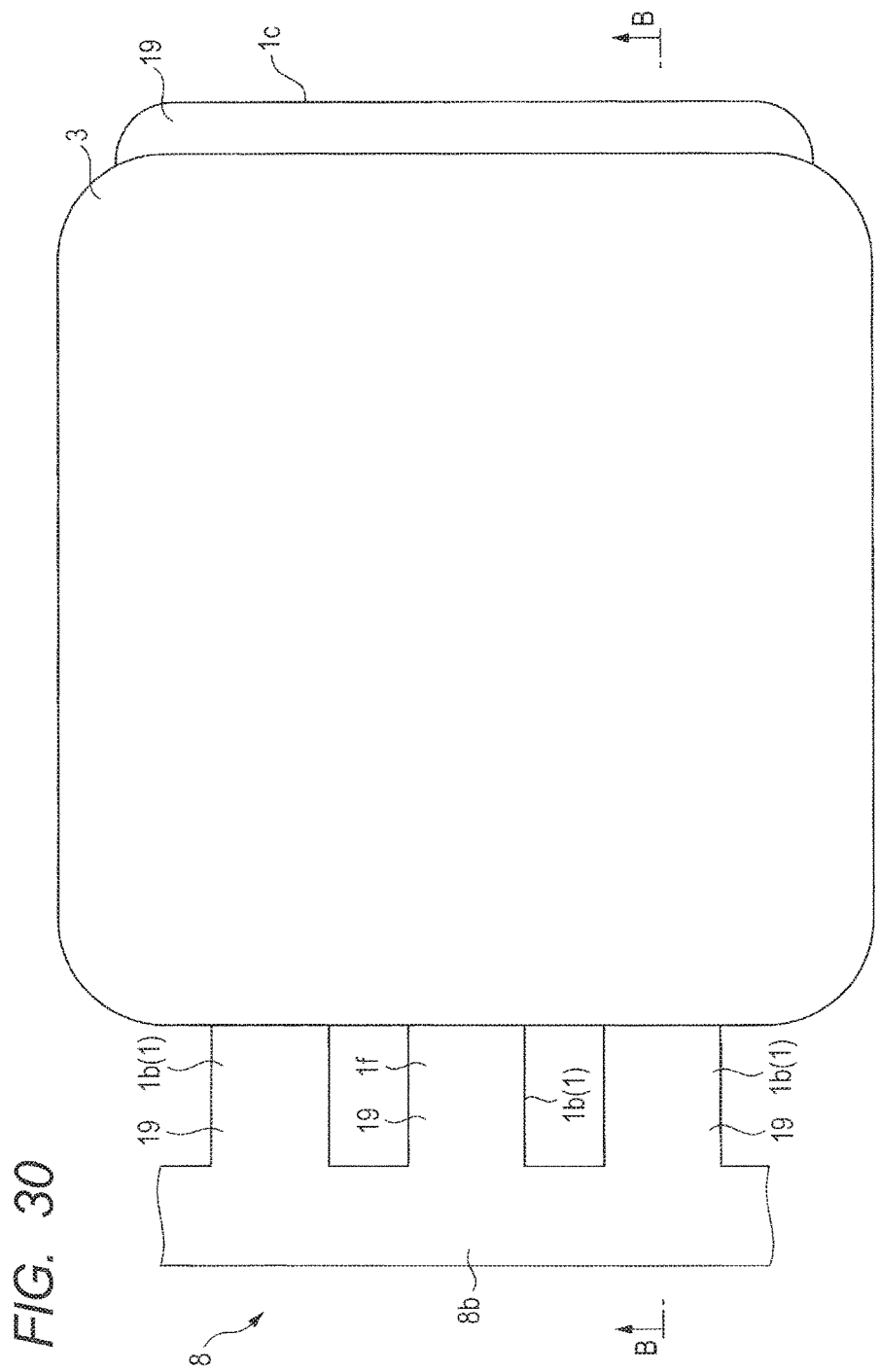
FIG. 30 is a partial plan view illustrating one example of a structure of the semiconductor device illustrated in FIG. 1 which is obtained after formation of a plated film.
Figure 31:
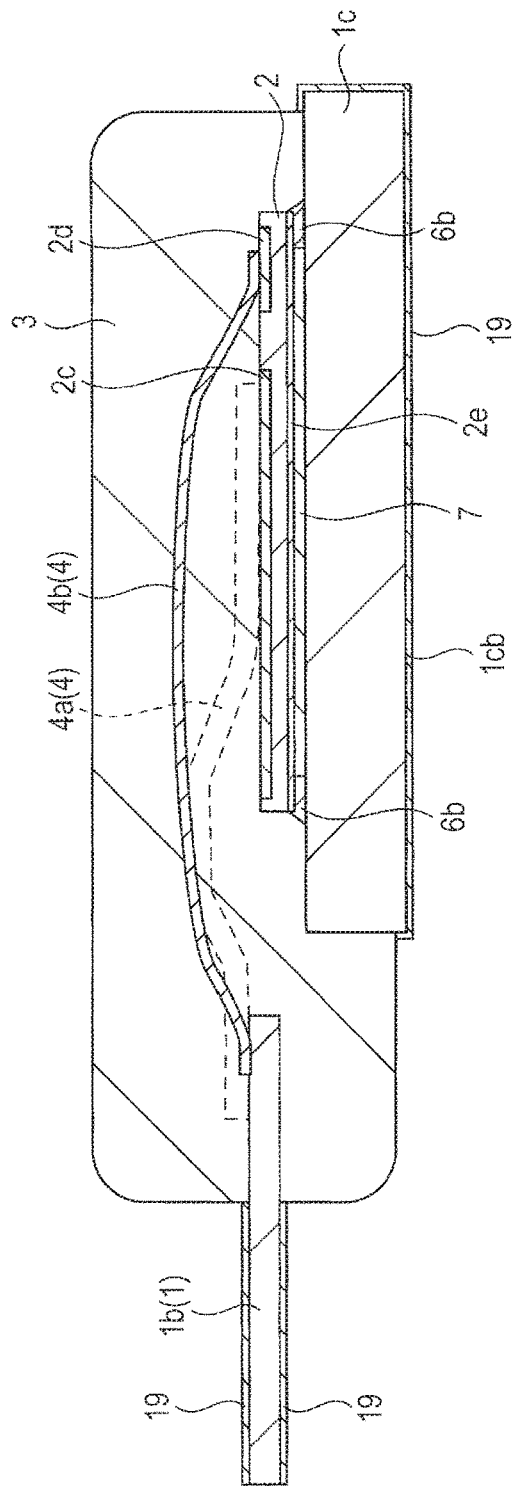
FIG. 31 is a sectional diagram illustrating one example of the structure cut along the B-B line in FIG. 30.

FIG. 30 is a partial plan view illustrating one example of a structure of the semiconductor device illustrated in FIG. 1 which is obtained after formation of a plated film and FIG. 31 is a sectional diagram illustrating one example of the structure cut along the B-B line in FIG. 30.

Plating is performed after completion of the resin sealing.

A plated film 19 which is a metal film is formed on each of the outer lead part (the external terminal, the source lead 1d, the gate lead 1e) 1b and the lower surface 1cb of the chip mounting part 1c which is exposed from the sealing body 3 in the plating process as illustrated in FIG. 30 and FIG. 31.

6. Lead Forming (Dicing)

Lead forming is performed after completion of the plating.

The power device 5 illustrated in FIG. 1 is diced (cut and formed) by separating the power device 5 from the lead frame 8 illustrated in FIG. 6 in the lead forming process. Specifically, the respective outer lead parts 1b and the suspension lead if illustrated in FIG. 1 are diced by separating them from the frame part 8b of the lead frame 8 illustrated in FIG. 6 and thereby the power device 5 is acquired.

Assembly of the power device 5 illustrated in FIG. 1 is completed in the above-described way.

[Modified Examples]

The modified examples of the present embodiment will be described. Here, assembly that drying of the sintered-silver-use paste 6b is not performed in the die bonding process will be described.

Figure 32:
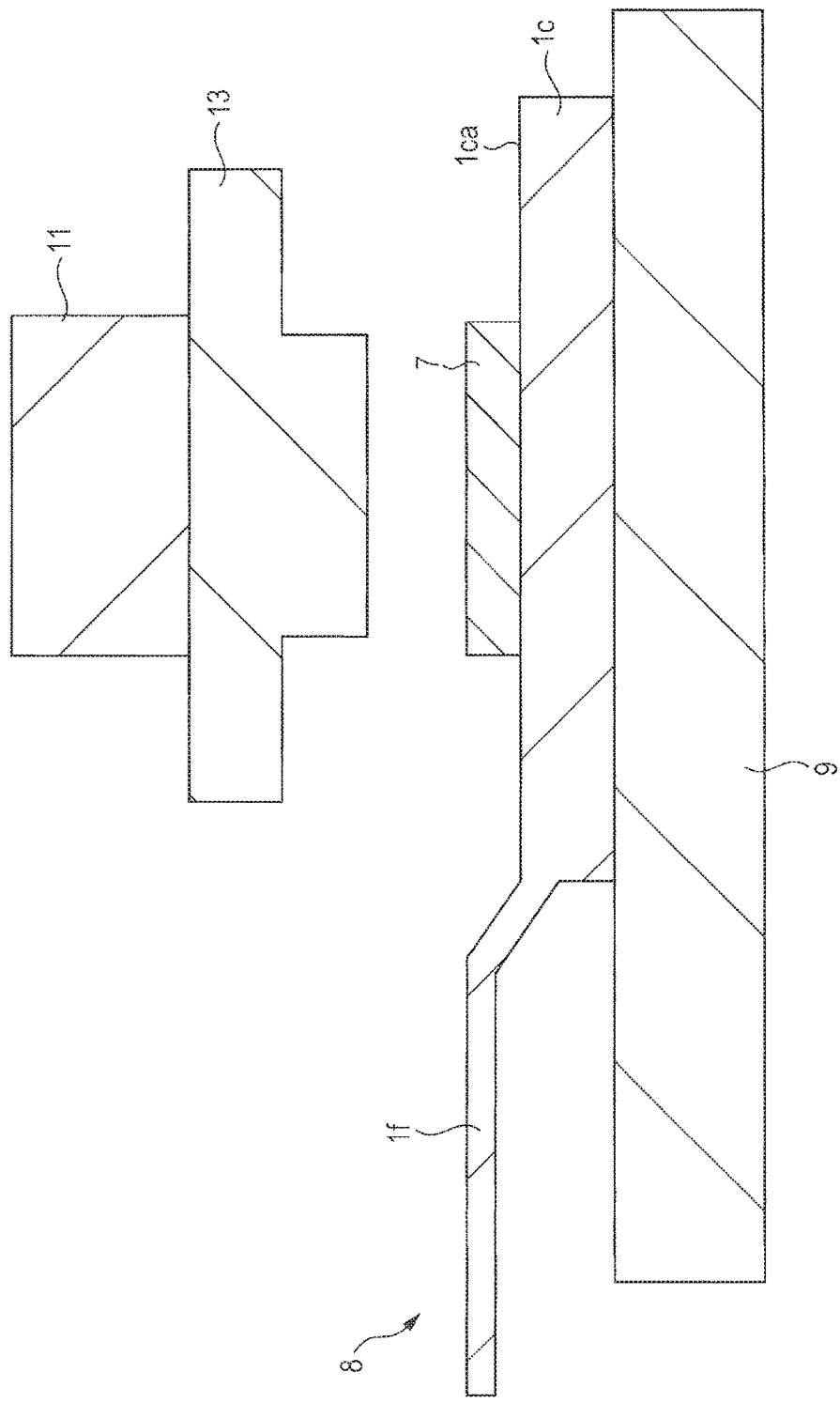
FIG. 32 is a sectional diagram illustrating one example of the silver paste application step according to one modified example in the semiconductor device illustrated in FIG. 1.
Figure 33:
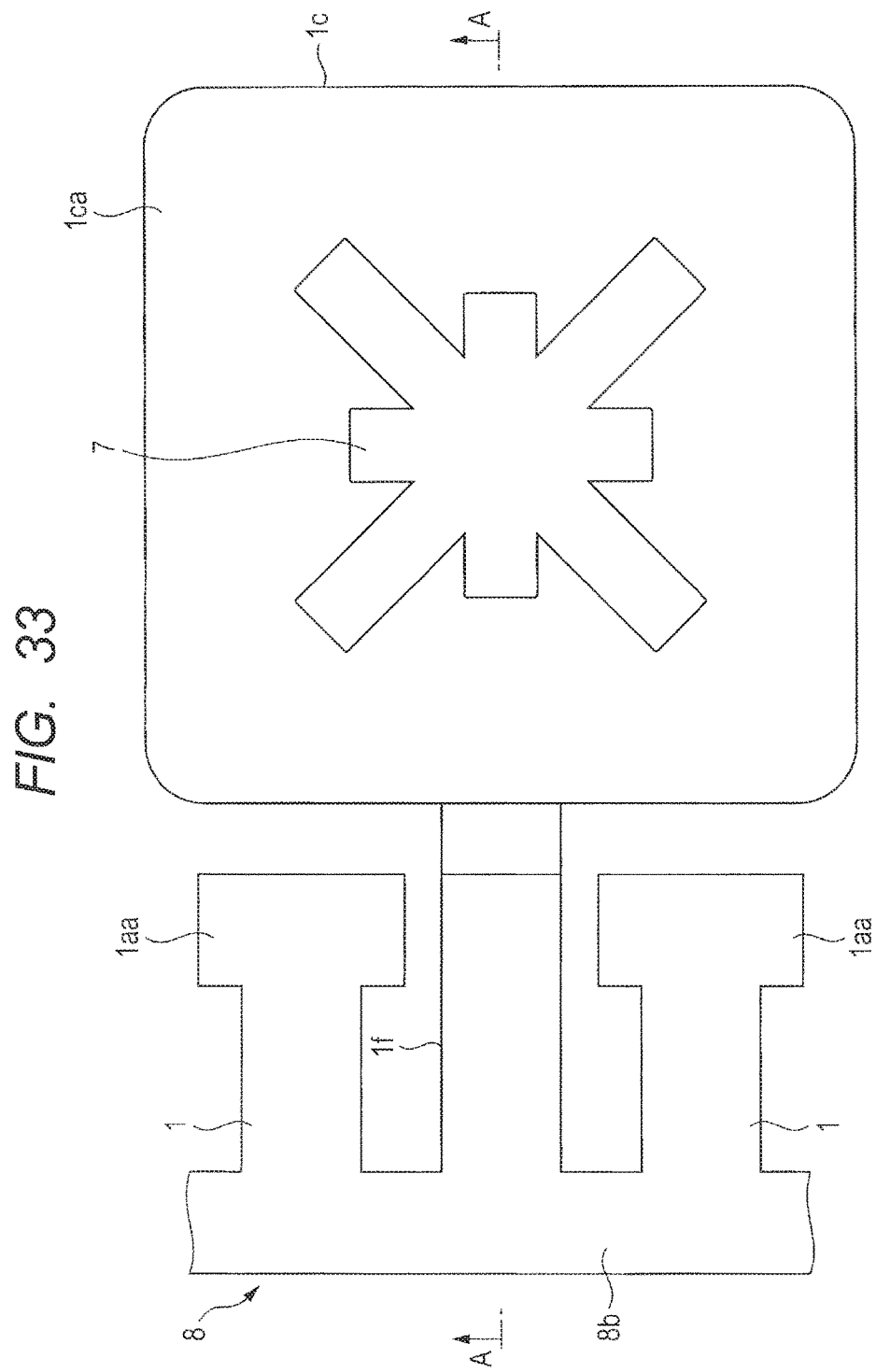
FIG. 33 is a partial plan view illustrating one example of a structure of the semiconductor device illustrated in FIG. 1 which is obtained after application of the silver paste in the modified example.
Figure 34:
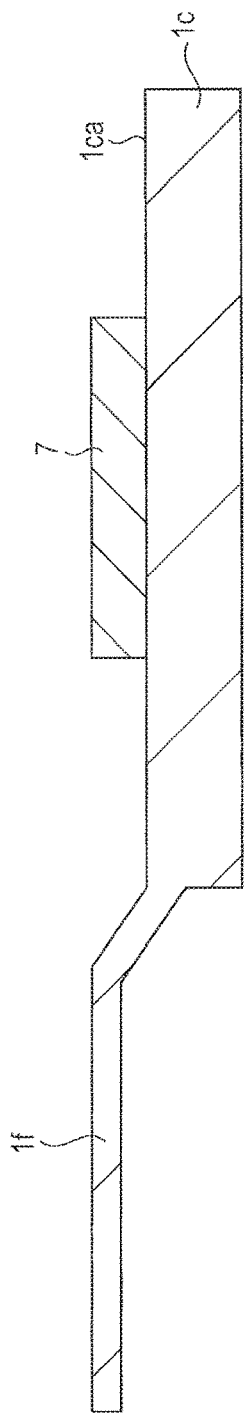
FIG. 34 is a sectional diagram illustrating one example of the structure cut along the A-A line in FIG. 33.

FIG. 32 is a sectional diagram illustrating one example of the silver paste application step according to one modified example in the semiconductor device illustrated in FIG. 1, FIG. 33 is a partial plan view illustrating one example of a structure of the semiconductor device illustrated in FIG. 1 which is obtained after application of the silver paste in the modified example and FIG. 34 is a sectional diagram illustrating one example of the structure cut along the A-A line in FIG. 33.

In the die bonding process, first, the chip mounting part 1 of the lead frame 8 is installed on the stage 9 and the silver (Ag) paste 7 is applied onto the upper surface (the second front surface) 1ca of the chip mounting part 1c of the lead frame 8 by using the single point nozzle 13 which is attached to the syringe 11 after installation of the chip mounting part 1c as illustrated in FIG. 32. The silver paste 7 is applied to the central part and its vicinity of the chip mounting part 1c as illustrated in the plan view in FIG. 33 and the sectional diagram in FIG. 34. Describing in another expression, the silver paste 7 is applied to the second region 1cab which is located between the plurality of respective first regions 1caa illustrated in FIG. 21 (that is, among the first regions 1caa in the planar view).

In this case, the silver paste 7 may be applied by using the multipoint nozzle.

Incidentally, also in the modified example illustrated in FIG. 32 to FIG. 34, the silver paste 7 means the paste of the type that in a case where the volume ratio of silver before cured is 1, the volume ratio of the resin component amounts to about 0.7 and in a case where the volume ratio of silver after cured is 1, the volume ratio of the resin component amounts to about 0.5.

The sintered-silver-use paste 6b is applied after application of the silver paste 7.

Figure 35:
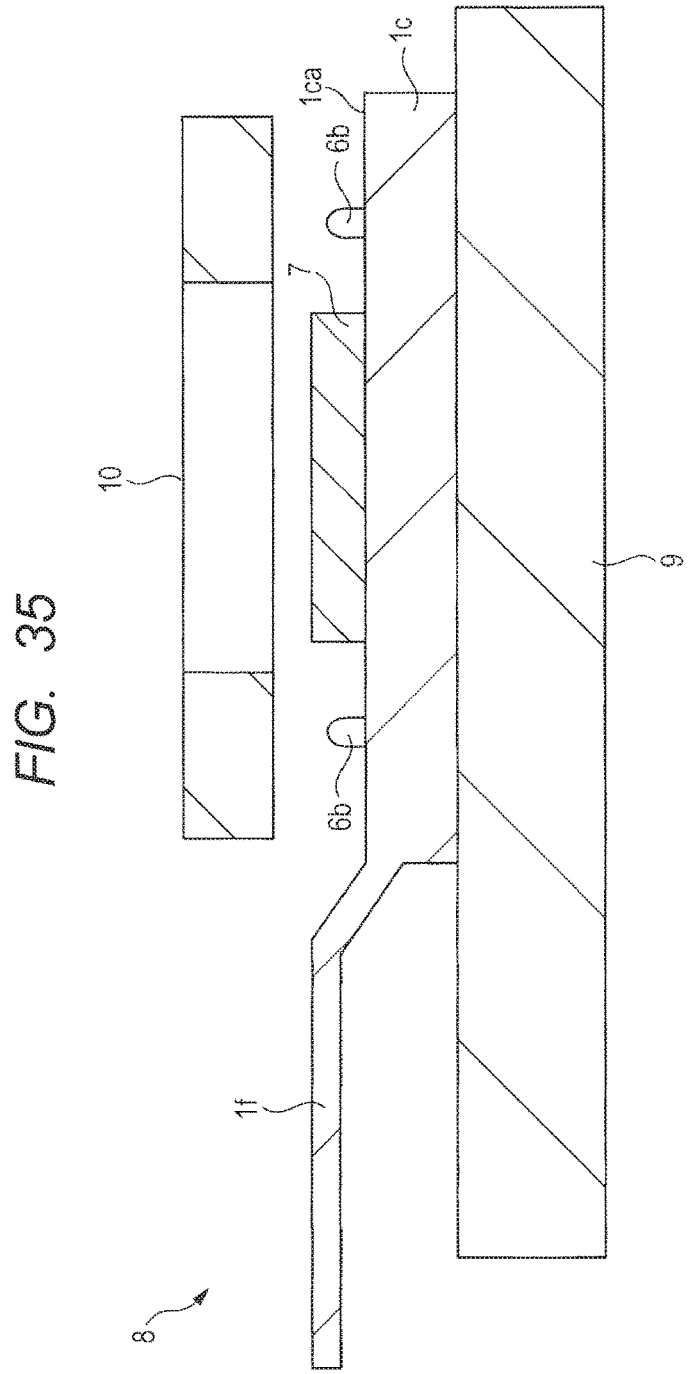
FIG. 35 is a sectional diagram illustrating one example of the sintered-silver-use paste application step according to one modified example in the semiconductor device illustrated in FIG. 1.
Figure 36:
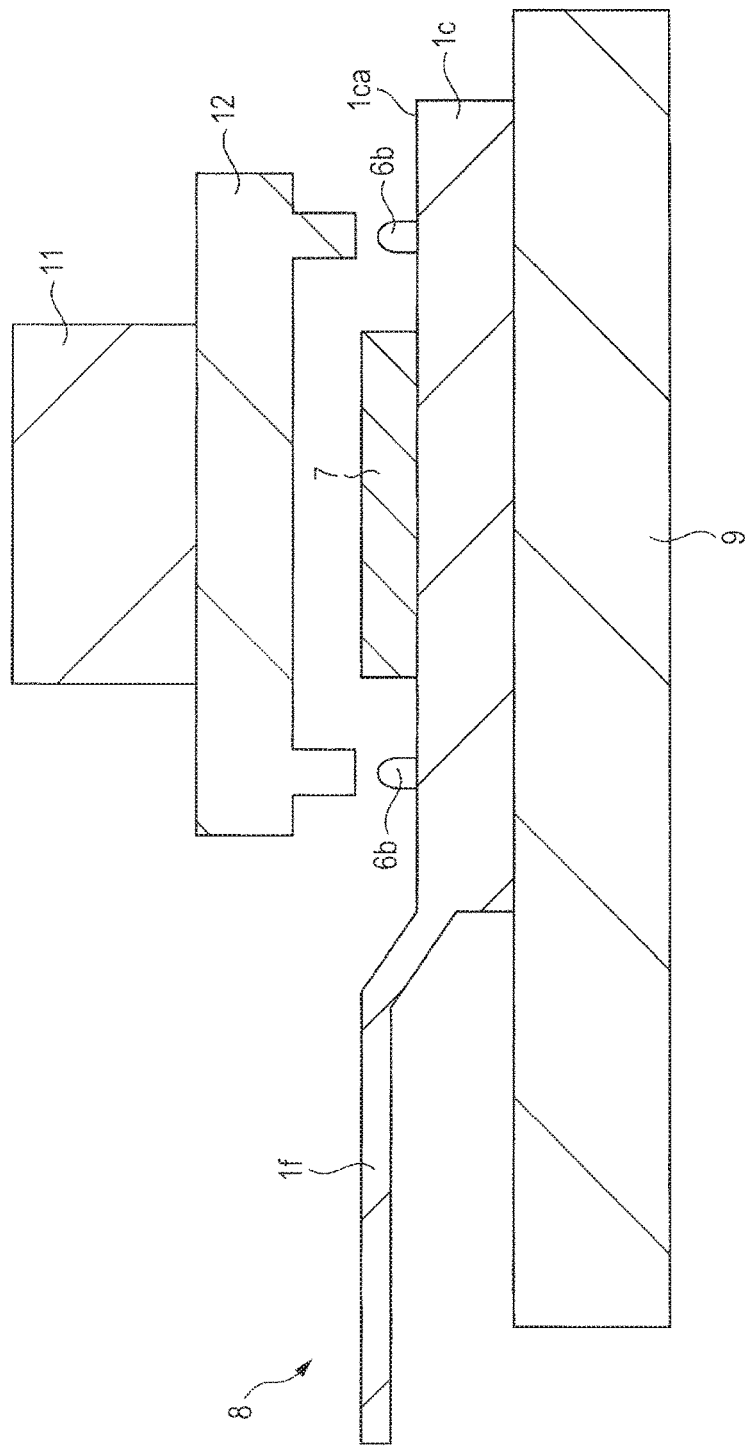
FIG. 36 is a sectional diagram illustrating one example of the sintered-silver-use paste application step according to another modified example in the semiconductor device illustrated in FIG. 1.
Figure 37:
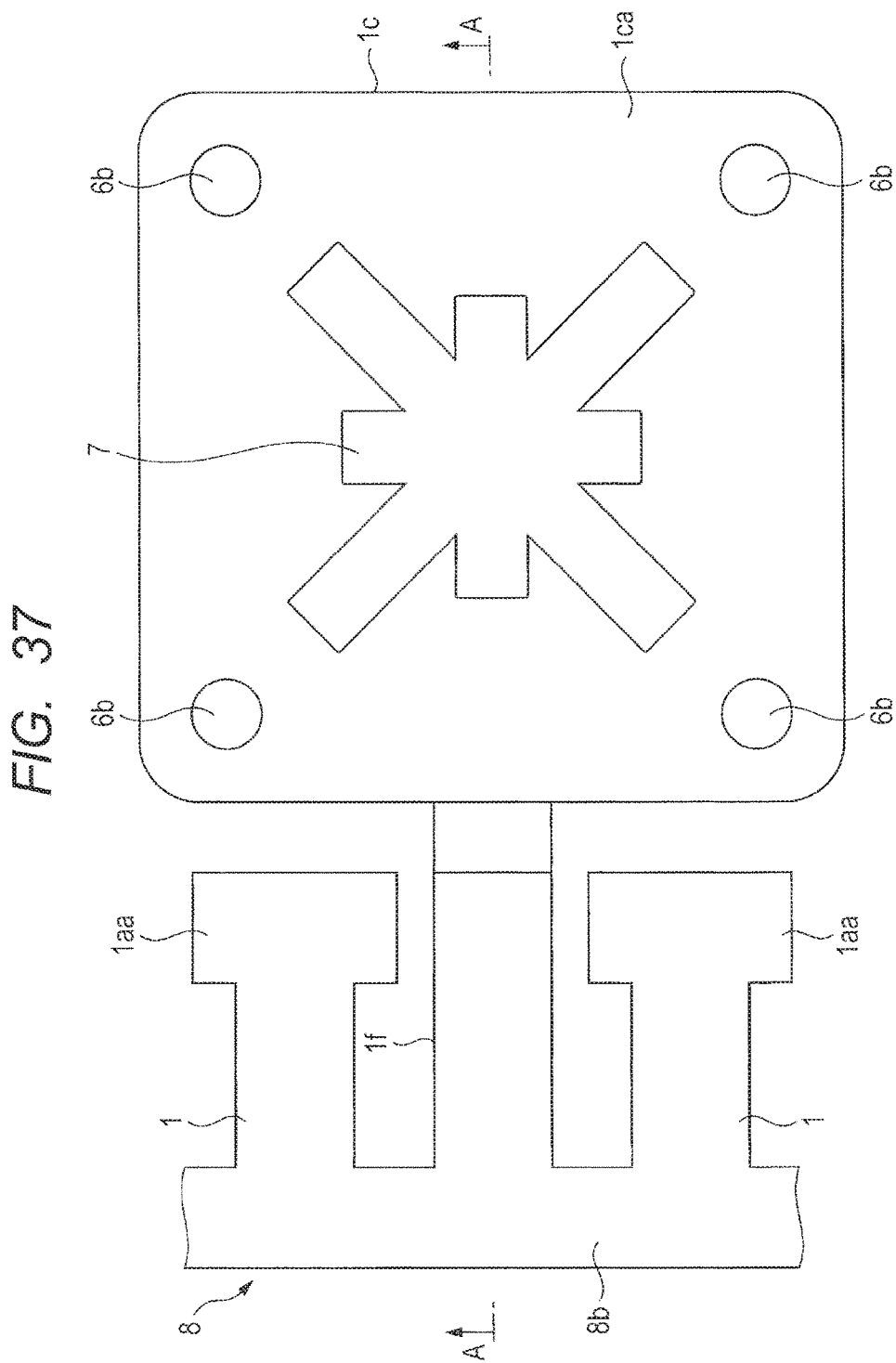
FIG. 37 is a partial plan view illustrating one example of a structure of the semiconductor device illustrated in FIG. 1 which is obtained after application of the sintered-silver-use paste in the modified example in FIG. 35 or FIG. 36.
Figure 38:
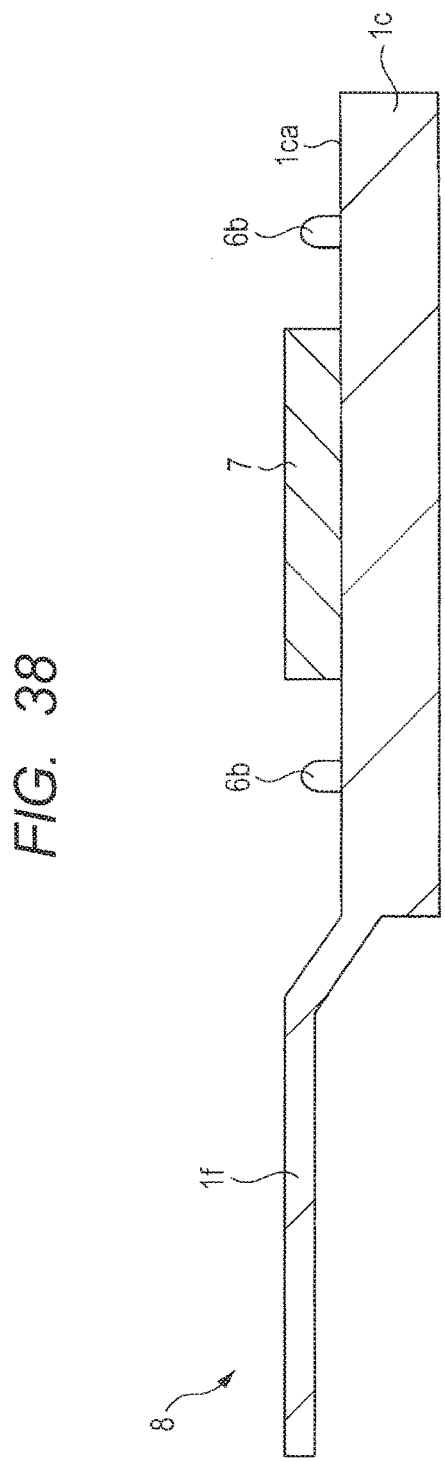
FIG. 38 is a sectional diagram illustrating one example of the structure cut along the A-A line in FIG. 37.
Figure 39:
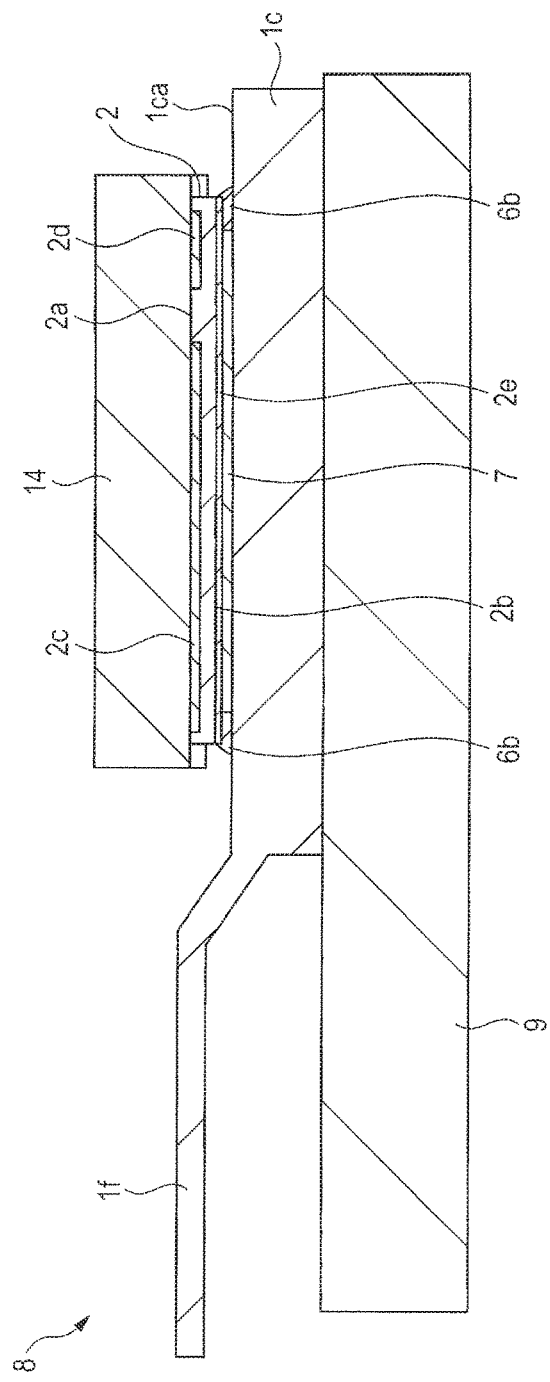
FIG. 39 is a sectional diagram illustrating one modified example of the chip installation step in the die bonding process for the semiconductor device illustrated in FIG. 1.

FIG. 35 is a sectional diagram illustrating one example of the sintered-silver-use paste application step according to one modified example in the semiconductor device illustrated in FIG. 1, FIG. 36 is a sectional diagram illustrating one example of the sintered silver paste application step according to another modified example in the semiconductor device illustrated in FIG. 1, FIG. 37 is a partial plan view illustrating one example of a structure of the semiconductor device illustrated in FIG. 1 which is obtained after application of the sintered-silver-use paste in the modified example in FIG. 35 or FIG. 36 and FIG. 38 is a sectional diagram illustrating one example of the structure cut along the A-A line in FIG. 37.

The sintered-silver-use paste 6b is applied onto the upper surface 1ca of the chip mounting part 1c onto which the silver paste 7 is applied as illustrated in FIG. 35. The sintered-silver-use paste 6b which is handled here is the pasted sintered silver material. In addition, the region to which the sintered-silver-use paste 6b is to be applied is each of the plurality of first regions 1caa on the upper surface 1ca of the chip mounting part 1c illustrated in FIG. 21 and the sintered-silver-use paste 6b is applied to each of the plurality of first regions 1caa. Here, the sintered-silver-use paste 6b is applied to each of the four corners and their vicinities of the upper surface 1ca of the chip mounting part 1c which is almost square in the planar view as illustrated in FIG. 37.

In this case, the sintered-silver-use paste 6b which is the pasted sintered silver material is applied onto the upper surface 1ca of the chip mounting part 1c by, for example, screen printing. Describing in detail, the lead frame 8 is placed on the stage 9 as illustrated in FIG. 35 and the sintered-silver-use paste 6b is applied onto the upper surface 1ca of the chip mounting part 1c of the lead frame 8 in a state of placing the lead frame 8 on the stage 9 by using the metal mask 10. In this case, the sintered-silver-use paste 6b is applied to each of the plurality of first regions 1caa illustrated in FIG. 21 on the upper surface 1ca of the chip mounting part 1c.

Incidentally, in the modified example illustrated in FIG. 35, the sintered-silver-use paste 6b means the paste of the type that in a case where the volume ratio of silver before cured is 1, the volume ratio of the resin component amounts to about 0.3 and therefore there exists almost no resin component after cured.

In addition, alternatively, the sintered-silver-use paste 6b may be applied onto the upper surface 1ca of the chip mounting part 1c of the lead frame 8 by using the shower nozzle (the multipoint nozzle) 12 as illustrated in FIG. 36. That is, the sintered-silver-use paste 6b is applied onto the upper surface 1ca of the chip mounting part 1c at multiple points by using the shower nozzle 12 which is attached to the syringe 11.

It is possible to efficiently apply the sintered-silver-use paste 6b to the plurality of first regions 1caa on the upper surface 1ca of the chip mounting part 1c by applying the sintered-silver-use paste 6b at the multiple points by using the shower nozzle 12 in this way and thereby it is possible to improve the productivity in mass production of the power device 5.

Further, the sintered-silver-use paste 6b may be applied onto the upper surface 1ca of the chip mounting part 1c by using the single-point nozzle 13 (see FIG. 32) as a further another modified example.

Incidentally, the application amount of the silver paste 7 is large in comparison with the total application amount of the sintered-silver-use paste 6b which is applied to the four portions as illustrated in FIG. 37 and FIG. 38.

In addition, it is possible to compare the sintered-silver-use paste 6b with the silver paste 7 as illustrated in FIG. 13 also in the modified examples in FIG. 35 and FIG. 36. That is, the silver paste 7 is 60 to 90 wt % and the sintered-silver-use paste 6b is at least 80 wt % in silver content. In addition, the silver paste 7 is up to 40 wt % and the sintered-silver-us paste 6b is up to 20 wt % in resin $ solvent blending quantity. Further, in a case where the silver paste 7 is compared with the sintered-silver-use paste 6b in void ratio (the ratio of voids per unit volume is expressed in percentage), the relation of the void ratio of the sintered-silver-use paste 6b>the void ratio of the silver paste 7 is established. Incidentally, in a case where the silver paste 7 is compared with the sintered-silver-use past 6b in porosity (the value obtained by averaging the ratio that the pores occupy in the optional section of the bonding layer among the plurality of sections), the relation of the porosity of the sintered-silver-use paste 6b>the porosity of the silver paste 7 is established.

The semiconductor chip 2 is mounted onto the chip mounting part 1c by using the collet 14 as illustrated in FIG. 19 after application of the silver paste 7 and the sintered-silver-use paste 6b. In this case, the semiconductor chip 2 is conveyed in a state of holding the semiconductor chip 2 by the collet 14 and thereafter the semiconductor chip 2 is mounted onto the chip mounting part 1c in such a manner that the rear surface 2b of the semiconductor chip 2 faces the upper surface 1ca of the chip mounting part 1c with the sintered-silver-use paste 6b and the silver paste 7 being interposed.

After mounting the semiconductor chip 2, the step of curing the silver paste 7 and thereby the sintered-silver-use paste 6b is performed and thereby the die bonding process is completed.

The die bonding process may be performed in such a manner that the sintered-silver-use paste 6b is applied to the first regions 1caa of the chip mounting part 1c, the silver paste 7 is applied to the second region 1cab of the chip mounting part 1c and then each of the four corners of the semiconductor chip 2 is arranged in each of the first regions 1caa in the planar view similarly to the structures illustrated in FIG. 17 to FIG. 22 also in the die bonding processes according to the modified examples illustrated in FIG. 35 and FIG. 36.

Incidentally, although a case where there is no step of drying the sintered-silver-use paste 6b and therefore the sintered-silver-use paste 6b is applied after application of the silver paste 7 is described in the die bonding processes according to the modified examples in FIG. 35 and FIG. 36, the sintered-silver-use paste 6b may be applied and then the silver paste 7 may be applied in the die bonding processes according to the modified examples in FIG. 35 and FIG. 36.

<Effects>

According to the manufacturing method for the semiconductor device (the power device 5) pertaining to the present embodiment, the bonding portions which are configured by the sintered-silver-use paste 6b (the sintered silver 6) are arranged directly under the corners of the semiconductor chip 2 in the planar view and thereby occurrence of the chip-die bonding material destruction (the cracks, the delamination) directly under each of the plurality of corners of the semiconductor chip 2 becomes difficult.

That is, even in a case where the thermal stress generated due to the difference in linear expansion coefficient between the semiconductor chip 2 and the chip mounting part (the die pad) 1c is applied in the temperature cycle test and so forth performed after completion of the product, the bonding portions which are configured by the sintered-silver-use paste 6b (the sintered silver 6) are arranged directly under the corners of the semiconductor chip 2 and thereby it is possible to increase the strength of the bonding portions. Thereby, occurrence of the chip-die bonding material destruction directly under each of the corners of the semiconductor chip 2 becomes difficult. That is, it is possible to suppress the occurrence of the chip-die bonding material destruction directly under each of the corners of the semiconductor chip 2.

Consequently, it is possible to improve the reliability of the semiconductor device (the power device 5).

In addition, since on the chip mounting part 1c, the area of the second region 1cab to which the silver paste 7 is applied is larger than the gross area of the first regions 1caa to which the sintered-silver-use paste 6b is applied in the planar view, it is possible to avoid deformation of the chip mounting part 1c caused by curing of the sintered-silver-use paste 6b.

In other words, the area over which the silver paste 7 is bonded to the semiconductor chip 2 is larger than the area over the sintered-silver-use paste 6b is bonded to the semiconductor chip 2. Thereby, it is possible to avoid deformation of the chip mounting part 1c caused by curing of the sintered-silver-use paste 6b and it is possible to improve the reliability of the semiconductor device (the power device 5) as described above.

Further, in the semiconductor device (the power device 5) for which the high adaptability to heat dissipation is requested, it is possible to avoid deformation of the chip mounting part 1c and thereby it is possible to improve the reliability and quality of the semiconductor device (the power device 5) even in a structure that the thickness of the chip mounting part 1c is thinned for further improvement of heat dissipation property.

In addition, it is possible to reduce the fluidity of the sintered-silver-use paste 6b by drying the sintered-silver-use paste 6b in the die bonding process. In addition, the sintered-silver-use paste 6b is dried before application of the silver paste 7 and thereby it is possible to suppress the reduction in adhesiveness of the silver paste 7 to the semiconductor chip 2 caused by drying. That is, the sintered-silver-use paste 6b is dried before application of the silver paste 7 and thereby it is possible to suppress the reduction in adhesiveness of the silver paste 7 to the semiconductor chip 2 and to reduce occurrence of positional displacement of the semiconductor chip 2 when mounting the semiconductor chip 2 onto the chip mounting part 1c.

Although the invention which is made by the inventors of the present invention is described on the basis of the embodiment, it goes without saying that the present invention is not limited to the above-described embodiment and may be modified and altered in a variety of ways within the range not deviating from the gist of the present invention.

For example, although a case where each of the plurality of outer lead parts 1b of the semiconductor device (the power device 5) is exposed from the sealing body 3 and extends straight is described in the above-described embodiment, each of the plurality of outer lead parts q1b may be bent into, for example, a gull wing shape.

Further, in a case where the semiconductor device is the die pad exposed type GFP and so forth, an IC (Integrated Circuit) in which an MCU (Micro Control Unit) is built may be used as an element to be incorporated into the semiconductor device.

In addition, it is possible to apply the structures of the embodiment and the modified examples to practical use in combination within a range not deviating from the gist of the technical idea described in the above-mentioned embodiment.

What is claimed is:

1. A manufacturing method for semiconductor device comprising the steps of:
    (a) providing a semiconductor chip having a first front surface and a first rear surface which is located on the opposite side of the first front surface;
    (b) providing a lead frame which includes a chip mounting part having a second front surface and a second rear surface which is located on the opposite side of the second front surface;
    (c) after the step (a) and the step (b), applying a first bonding material to each of a plurality of first regions on the second front surface of the chip mounting part;
    (d) after the step (c), drying the first bonding material;
    (e) after the step (d), applying a second bonding material to a second region which is located between/among the respective first regions;
    (f) after the step (e), mounting the semiconductor chip over the chip mounting part such that the first bonding material and the second bonding material are sandwiched by the first rear surface of the semiconductor chip and the second front surface of the chip mounting part; and
    (g) after the step (f), applying heat and pressure to the semiconductor chip and thereby bonding the first rear surface of the semiconductor chip, and the first bonding material and the second bonding material together,
    wherein, in plan view, the semiconductor chip has a first side which extends in a first direction, a second side which is located on the opposite side of the first side and extends in the first direction, a third side which extends in a second direction which intersects the first direction and a fourth side which is located on the opposite side of the third side and extends in the second direction
    wherein, in plan view, the semiconductor chip further has a first corner at which the first side and the third side intersect each other, a second corner at which the third side and the second side intersect each other, a third corner at which the second side and the fourth side intersect each other and a fourth corner at which the fourth side and the first side intersect each other, and
    wherein, in plan view, after the step (f), part of each of the first corner, the second corner, the third corner and the fourth corner is located in each of the first regions.

2. The manufacturing method for semiconductor device according to claim 1, wherein after the step (f), in plan view, the sum of areas of the first regions is smaller than an area of the second region.

3. The manufacturing method for semiconductor device according to claim 2,
    wherein after step (f), in plan view, the second region is located between a third region included in the first regions and a fourth region included in the first regions, and
    wherein, in plan view, a length of the second region is larger than the sum of a length of the third region and a length of the fourth region.

4. The manufacturing method for semiconductor device according to claim 1,
    wherein after the step (f), in plan view, the first bonding material which is applied to each of the first regions has:
        a first portion which is sandwiched between the semiconductor chip and the chip mounting part; and
        a second portion which is not sandwiched between the semiconductor chip and the chip mounting part, and
    wherein, in plan view, a length of the first portion is larger than a length of the second portion.

5. The manufacturing method for semiconductor device according to claim 1, wherein a temperature at which the first bonding material and the second bonding material are heated in the step (f) is higher than a temperature at which the first bonding material is dried in the step (d).

6. The manufacturing method for semiconductor device according to claim 1, further comprising the step of:
(h) after the step (g), forming a sealing body which covers at least part of the semiconductor chip and part of the chip mounting part and has a third front surface and a third rear surface which is located on the opposite side of the third front surface,
wherein after the step (h), the second rear surface of the chip mounting part is exposed to the third rear surface of the sealing body.

7. The manufacturing method for semiconductor device according to claim 1, wherein in the step (c), the first bonding material is applied to the second front surface of the chip mounting part at multiple points.

8. The manufacturing method for semiconductor device according to claim 1, wherein a source-use electrode and a gate-use electrode are exposed to the first front surface of the semiconductor chip, and
wherein the semiconductor chip includes a drain-use electrode over the first rear surface.

9. A manufacturing method for semiconductor device comprising the steps of:
(a) providing a semiconductor chip having a first front surface and a first rear surface which is located on the opposite side of the first front surface;
(b) providing a lead frame which includes a chip mounting part having a second front surface and a second rear surface which is located on the opposite side of the second front surface;
(c) after the step (a) and the step (b), applying one of a sintered-silver-use paste for forming sintered silver and a silver paste to the second front surface of the chip mounting part;
(d) after the step (c), applying the other of the sintered-silver-use paste and the silver paste to the second front surface of the chip mounting part;
(e) after the step (d), mounting the semiconductor chip over the chip mounting part such that the sintered-silver-use paste and the silver paste are sandwiched by the first rear surface of the semiconductor chip and the second front surface of the chip mounting part; and
(f) after the step (e), applying heat to the semiconductor chip and thereby bonding the first rear surface of the semiconductor chip, and the sintered-silver-use paste and the silver paste together,
wherein in the step (c) and the step (d), the sintered-silver-use paste is applied to each of a plurality of first regions on the second front surface of the chip mounting part and the silver paste is applied to a second region which is located between/among the respective first regions,
wherein, in plan view, the semiconductor chip has a first side which extends in a first direction, a second side which is located on the opposite side of the first side and extends in the first direction, a third side which extends in a second direction which intersects the first direction and a fourth side which is located on the opposite side of the third side and extends in the second direction,
wherein, in plan view, the semiconductor chip further has a first corner at which the first side and the third side intersect each other, a second corner at which the third side and the second side intersect each other, a third corner at which the second side and the fourth side intersect each other and a fourth corner at which the fourth side and the first side intersect each other, and wherein after the step (e), in plan view, part of each of the first corner, the second corner, the third corner and the fourth corner is located in each of the first regions.

10. The manufacturing method for semiconductor device according to claim 9, wherein after the step (e), in plan view, the sum of areas of the first regions is smaller than an area of the second region.

11. The manufacturing method for semiconductor device according to claim 9,
wherein after the step (e), in plan view, the second region is located between a third region included in the first regions and a fourth region included in the first, and
wherein, in plan view, a length of the second region is larger than the sum of a length of the third region and a length of the fourth.

12. The manufacturing method for semiconductor device according to claim 9,
wherein after the step (e), in plan view, the sintered-silver-use paste which is applied to each of the first regions has:
a first portion which is sandwiched between the semiconductor chip and the chip mounting part; and
a second portion which is not sandwiched between the semiconductor chip and the chip mounting part, and
wherein, in plan view, a length of the first portion is larger than a length of the second portion.

13. The manufacturing method for semiconductor device according to claim 9, further comprising the step of:
(g) after the step (f), forming a sealing body which covers at least part of the semiconductor chip and part of the semiconductor mounting part and has a third front surface and a third rear surface which is located on the opposite side of the third front surface,
wherein after the step (g), the second rear surface of the chip mounting part is exposed to the third rear surface of the sealing body.

14. The manufacturing method for semiconductor device according to claim 9, wherein in the step (c) or the step (d), the sintered-silver-use paste is applied to the second front surface of the chip mounting part at multiple points.

15. The manufacturing method for semiconductor device according to claim 9, wherein a source-use electrode and a gate-use electrode are exposed to the first front surface of the semiconductor chip, and
wherein the semiconductor chip includes a drain-use electrode over the first rear surface.

16. A semiconductor device comprising:
a semiconductor chip having a first front surface to which a first electrode and a second electrode are exposed and a first rear surface which is located on the opposite side of the first front surface and over which a third electrode is formed;
a chip mounting part having a second front surface over which the semiconductor chip is mounted and a second rear surface which is located on the opposite side of the second front surface;
a first lead which is electrically coupled to the first electrode of the semiconductor chip via a first conductive member;
a second lead which is electrically coupled to the second electrode of the semiconductor chip via a second conductive member; and
a sealing body which seals the semiconductor chip, the first conductive member, the second conductive member, part of the chip mounting part, part of the first lead and part of the second lead, wherein a first bonding material and a second boding material are sandwiched by the first rear surface of the semiconductor chip and the second front surface of the chip mounting part, wherein, in plan view, the second front surface of the chip mounting part has a plurality of first regions in which the first bonding material is located and a second region which is located between/among the respective first regions and in which the second bonding material is located, wherein, in plan view, the semiconductor chip has a first side which extends in a first direction, a second side which is located on the opposite side of the first side and extends in the first direction, a third side which extends in a second direction which intersects the first direction and a fourth side which is located on the opposite side of the third side and extends in the second direction, wherein, in plan view, the semiconductor chip further has a first corner at which the first side and the third side intersect each other, a second corner at which the third side and the second side intersect each other, a third corner at which the second side and the fourth side intersect each other and a fourth corner at which the fourth side and the first side intersect each other, and wherein, in plan view, part of each of the first corner, the second corner, the third corner and the fourth corner is located in each of the first regions.

17. The semiconductor device according to claim 16, wherein, in plan view, the sum of areas of the first regions is smaller than an area of the second region.

18. The semiconductor device according to claim 17, wherein, in plan view, the second region is located between a third region included in the first regions and a fourth region included in the first regions, and wherein in plan view, a length of the second region is larger than the sum of a length of the third region and a length of the fourth region.

19. The semiconductor device according to claim 16, wherein, in plan view, the first bonding material which is applied to each of the first regions has:
   a first portion which is sandwiched between the semiconductor chip and the chip mounting part; and
   a second portion which is not sandwiched between the semiconductor chip and the chip mounting part, and wherein, in plan view, a length of the first is larger than a length of the second portion.

20. The semiconductor device according to claim 16, wherein particles of the first bonding material are smaller than particles of the second bonding material in particle size.

* * * * *